United States Patent
Chiu

(10) Patent No.: US 11,515,388 B2
(45) Date of Patent: Nov. 29, 2022

(54) SEMICONDUCTOR DEVICE WITH P-N JUNCTION ISOLATION STRUCTURE AND METHOD FOR FABRICATING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/126,609

(22) Filed: Dec. 18, 2020

(65) Prior Publication Data

US 2022/0199768 A1    Jun. 23, 2022

(51) Int. Cl.
*H01L 29/76* (2006.01)
*H01L 29/06* (2006.01)
*H01L 29/10* (2006.01)
*H01L 29/66* (2006.01)

(52) U.S. Cl.
CPC ...... *H01L 29/0646* (2013.01); *H01L 29/1095* (2013.01); *H01L 29/6656* (2013.01)

(58) Field of Classification Search
None
See application file for complete search history.

(56) References Cited

U.S. PATENT DOCUMENTS

| | | | | |
|---|---|---|---|---|
| 4,115,914 A | * | 9/1978 | Harari | H01L 29/78 257/E29.151 |
| 6,329,691 B1 | * | 12/2001 | Finzi | H01L 27/0255 257/363 |
| 8,519,483 B1 | * | 8/2013 | Hart | H01L 27/1104 257/369 |
| 10,896,281 B2 | * | 1/2021 | Martin | G06F 30/398 |
| 2022/0109070 A1 | * | 4/2022 | Ono | H01L 29/7833 |

* cited by examiner

*Primary Examiner* — Ali Naraghi
(74) *Attorney, Agent, or Firm* — Muncy, Geissler, Olds & Lowe, P.C.

(57) ABSTRACT

The present application discloses a semiconductor device with a P-N junction isolation structure and a method for fabricating the semiconductor device. The semiconductor device includes a substrate, a first well layer positioned in the substrate and having a first electrical type, a bottom conductive layer positioned in the first well layer and having a second electrical type opposite to the first electrical type, a first insulating layer positioned on the bottom conductive layer, an isolation-mask layer positioned on the substrate and enclosing the first insulating layer, a first conductive line positioned on the first insulating layer, and a bias layer positioned in the first well layer and spaced apart from the bottom conductive layer. The bottom conductive layer, the first insulating layer, and the first conductive line together configure a programmable unit.

12 Claims, 38 Drawing Sheets

SEMICONDUCTOR DEVICE WITH P-N JUNCTION ISOLATION STRUCTURE AND METHOD FOR FABRICATING THE SAME

TECHNICAL FIELD

The present disclosure relates to a semiconductor device and a method for fabricating the semiconductor device, and more particularly, to a semiconductor device with a P-N junction isolation structure and a method for fabricating the semiconductor device with the P-N junction isolation structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first well layer positioned in the substrate and having a first electrical type, a bottom conductive layer positioned in the first well layer and having a second electrical type opposite to the first electrical type, a first insulating layer positioned on the bottom conductive layer, an isolation-mask layer positioned on the substrate and enclosing the first insulating layer, a first conductive line positioned on the first insulating layer, and a bias layer positioned in the first well layer and spaced apart from the bottom conductive layer. The bottom conductive layer, the first insulating layer, and the first conductive line together configure a programmable unit.

In some embodiments, the semiconductor device includes a second conductive line positioned above the bottom conductive layer and electrically coupled to the bottom conductive layer.

In some embodiments, the semiconductor device includes a first conductive layer positioned above the bias layer and electrically coupled to the bias layer.

In some embodiments, the bias layer has a same electrical type as the first well layer and a dopant concentration of the bias layer is greater than that of the first well layer.

In some embodiments, the first conductive line extends along a first direction in a top-view perspective and the second conductive line extends along a second direction perpendicular to the first direction.

In some embodiments, a thickness of the first insulating layer is between about 30 nm and about 70 nm.

In some embodiments, the semiconductor device includes a first assistance layer positioned on the bias layer, wherein the first assistance layer is formed of titanium silicide, nickel silicide, nickel platinum silicide, tantalum silicide, or cobalt silicide.

In some embodiments, a thickness of the first assistance layer is between about 2 nm and about 20 nm.

In some embodiments, the semiconductor device includes first spacers positioned on sidewalls of the first conductive line. The first spacers are formed of a dielectric material different from the first insulating layer.

In some embodiments, the semiconductor device includes second spacers positioned on sidewalls of the second conductive line. The second spacers are formed of silicon nitride, silicon nitride, silicon oxynitride, or silicon nitride oxide.

In some embodiments, the semiconductor device includes a top portion positioned between the first insulating layer and the bottom conductive layer. The tip portion is formed of silicon, germanium, silicon germanium, silicon carbon, silicon germanium carbon, gallium, gallium arsenic, indium arsenic, or indium phosphorus.

In some embodiments, the first insulating layer includes a capping portion positioned on the tip portion and flat portions connecting to two ends of the capping portion and positioned on the bottom conductive layer.

In some embodiments, the semiconductor device includes a deep well layer positioned surrounding the first well layer and having the second electrical type.

Another aspect of the present disclosure provides a semiconductor device including a substrate including a first well region, a first well layer positioned in the first well region and having a first electrical type, bottom conductive layers positioned in the first well layer and are spaced apart from each other, first insulating layers positioned on the bottom conductive layers, an isolation-mask layer positioned on the first well region and enclosing the first insulating layers, first conductive lines positioned on the first insulating layers and parallel to each other, a bias layer positioned in the first well layer and spaced apart from the bottom conductive layers. The bottom conductive layers have a second electrical type opposite to the first electrical type. The bottom conductive layers, the first insulating layers, the first conductive lines together configure programmable units.

In some embodiments, the thicknesses of the first insulating layers are the same.

In some embodiments, the thicknesses of the first insulating layers are different.

In some embodiments, the semiconductor device includes second conductive lines positioned above the first conductive lines and parallel to each other. The second conductive lines electrically couple to the bottom conductive layers.

Another aspect of the present disclosure provides a method for fabricating a semiconductor device including providing a substrate, forming a first well layer in the substrate and having a first electrical type, forming an isolation-mask layer on the first well layer, forming mask openings along the isolation-mask layer to expose portions of the first well layer, forming bottom conductive layers in the portions of the first well layer, forming a bias layer in the first well layer and spaced apart from the bottom conductive layers, forming first insulating layers on the bottom conductive layers, forming first conductive lines on the first insulating layers and parallel to each other. The bottom conductive layers have a second electrical type opposite to the first electrical type. The bottom conductive layers, the first insulating layers, the first conductive lines together configure programmable units.

In some embodiments, the method for fabricating the semiconductor device includes a step of forming second conductive lines above the first conductive lines to electrically couple to the bottom conductive layers.

In some embodiments, the method for fabricating the semiconductor device includes a step of forming a first conductive layer above the bias layer to electrically couple to the bias layer.

Due to the design of the semiconductor device of the present disclosure, the bottom conductive layers may be electrically isolated with a presence of biased voltage applied to the first well layer. As a result, a large amount of area of the substrate may be saved for more functional elements such as programmable units. In addition, the uniformity of the first insulating layers may also be improved. As a result, the reliability of programming the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
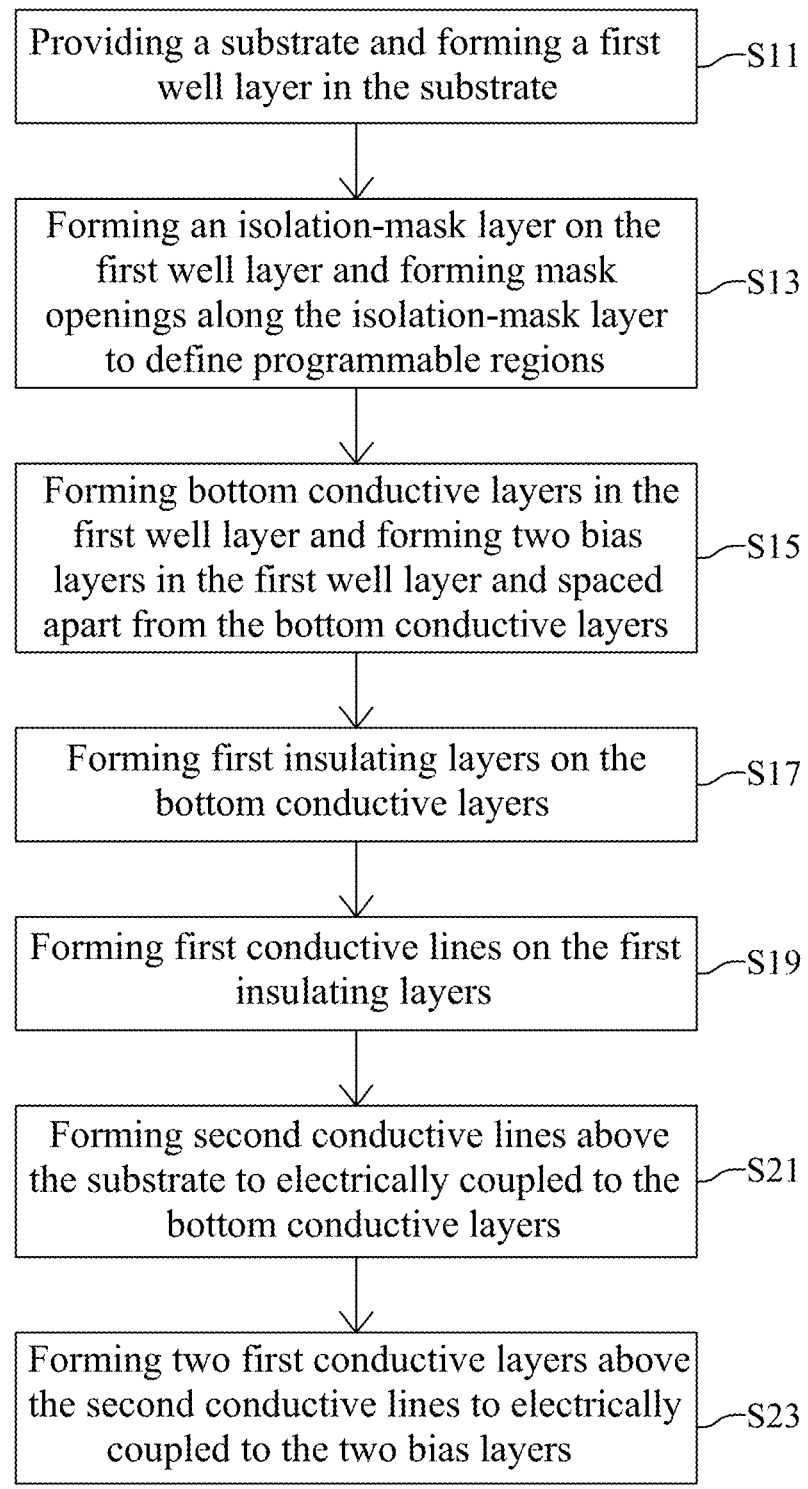
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
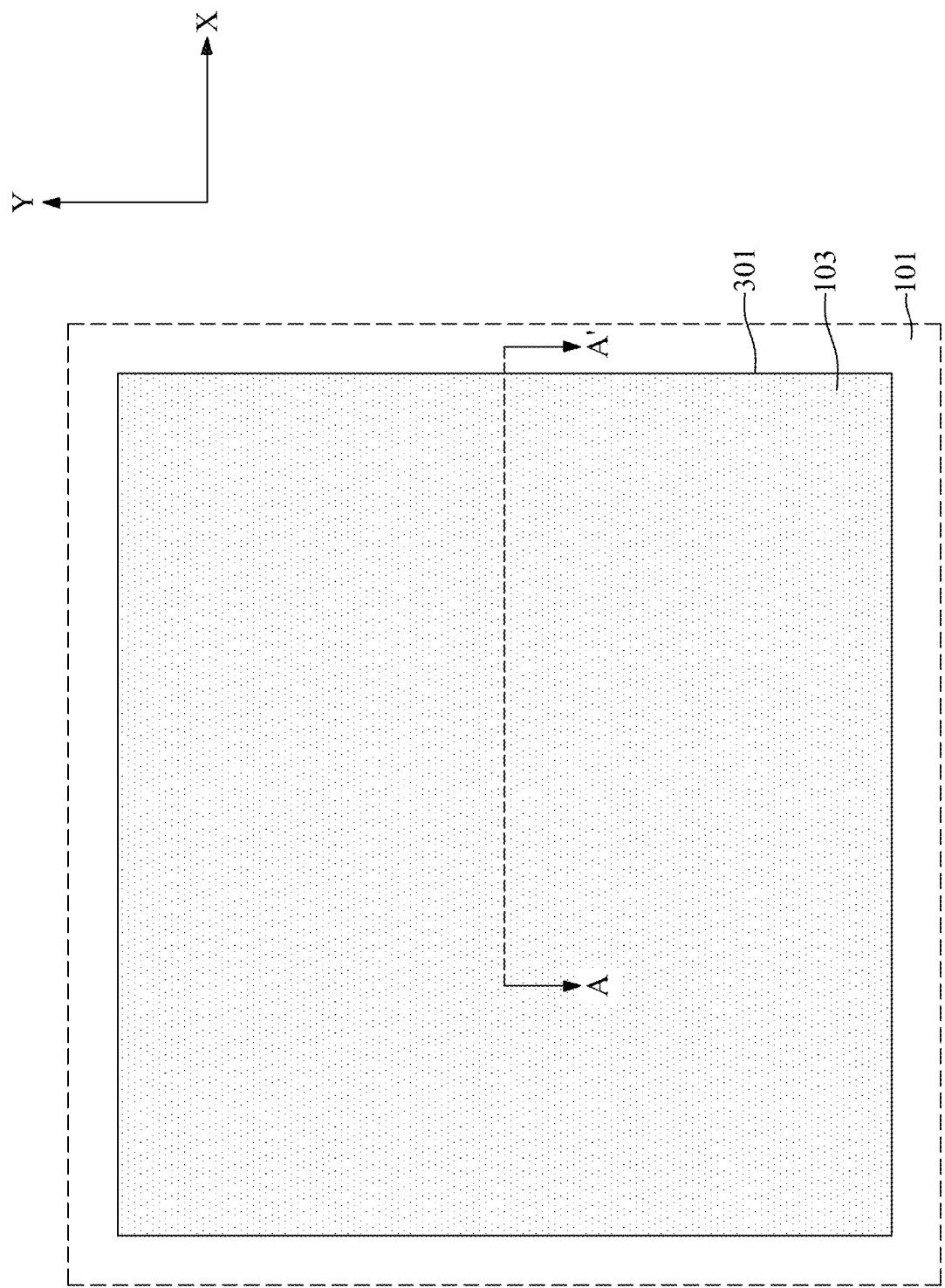
FIG. 2 illustrates, in a schematic top-view diagram, an intermediate semiconductor device in accordance with one embodiment of the present disclosure.
Figure 3:
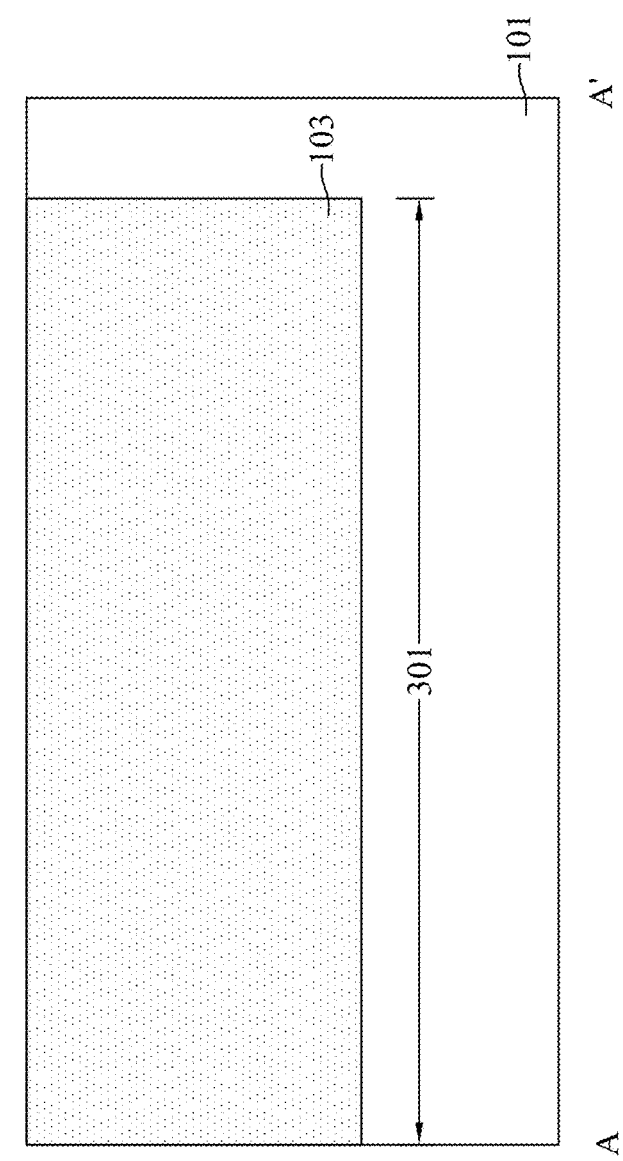
FIG. 3 is a schematic cross-sectional view diagram taken along a line A-A' in FIG. 2.
Figure 4:
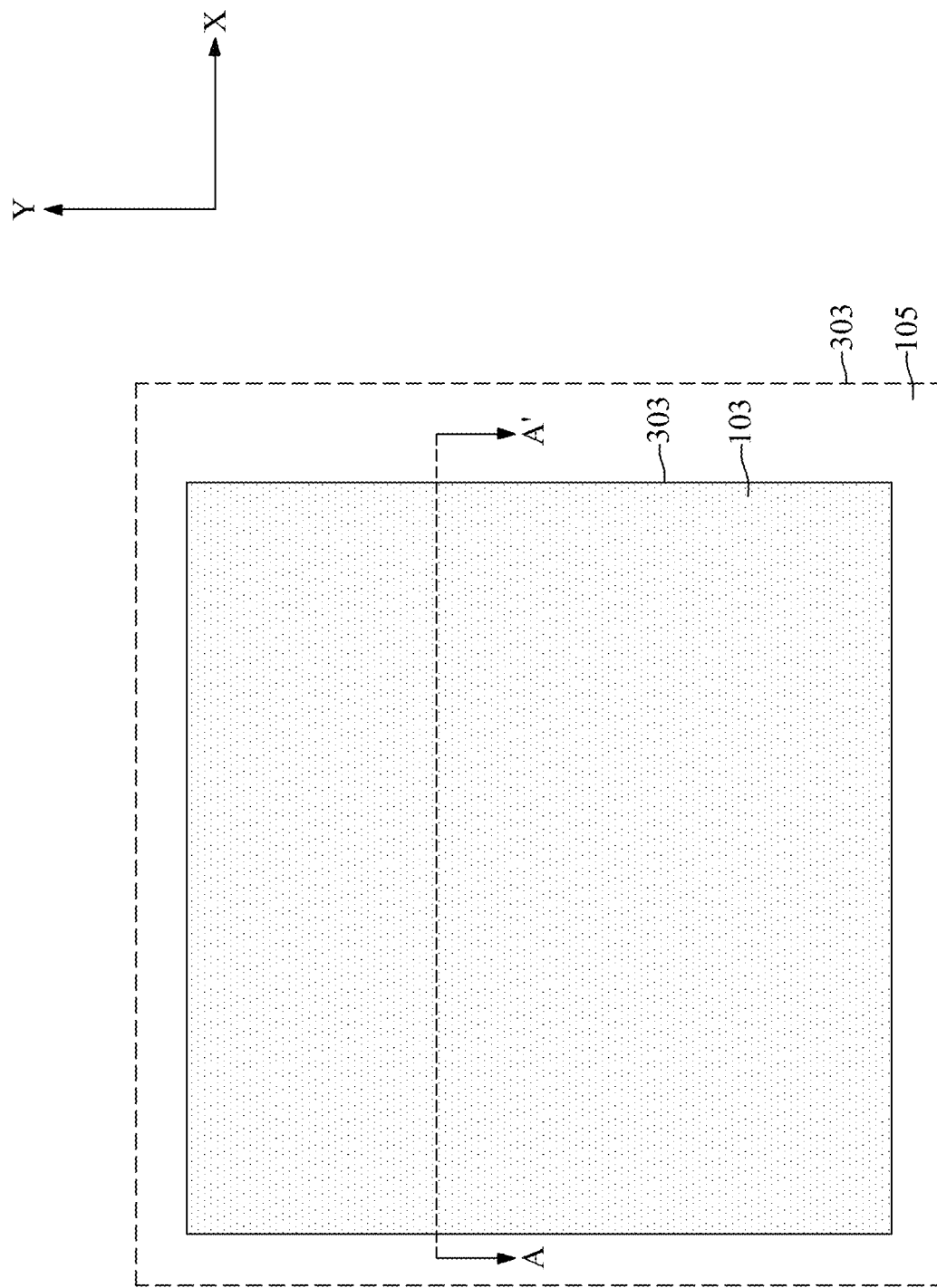
FIG. 4 illustrates, in a schematic top-view diagram, an intermediate semiconductor device in accordance with one embodiment of the present disclosure
Figure 5:
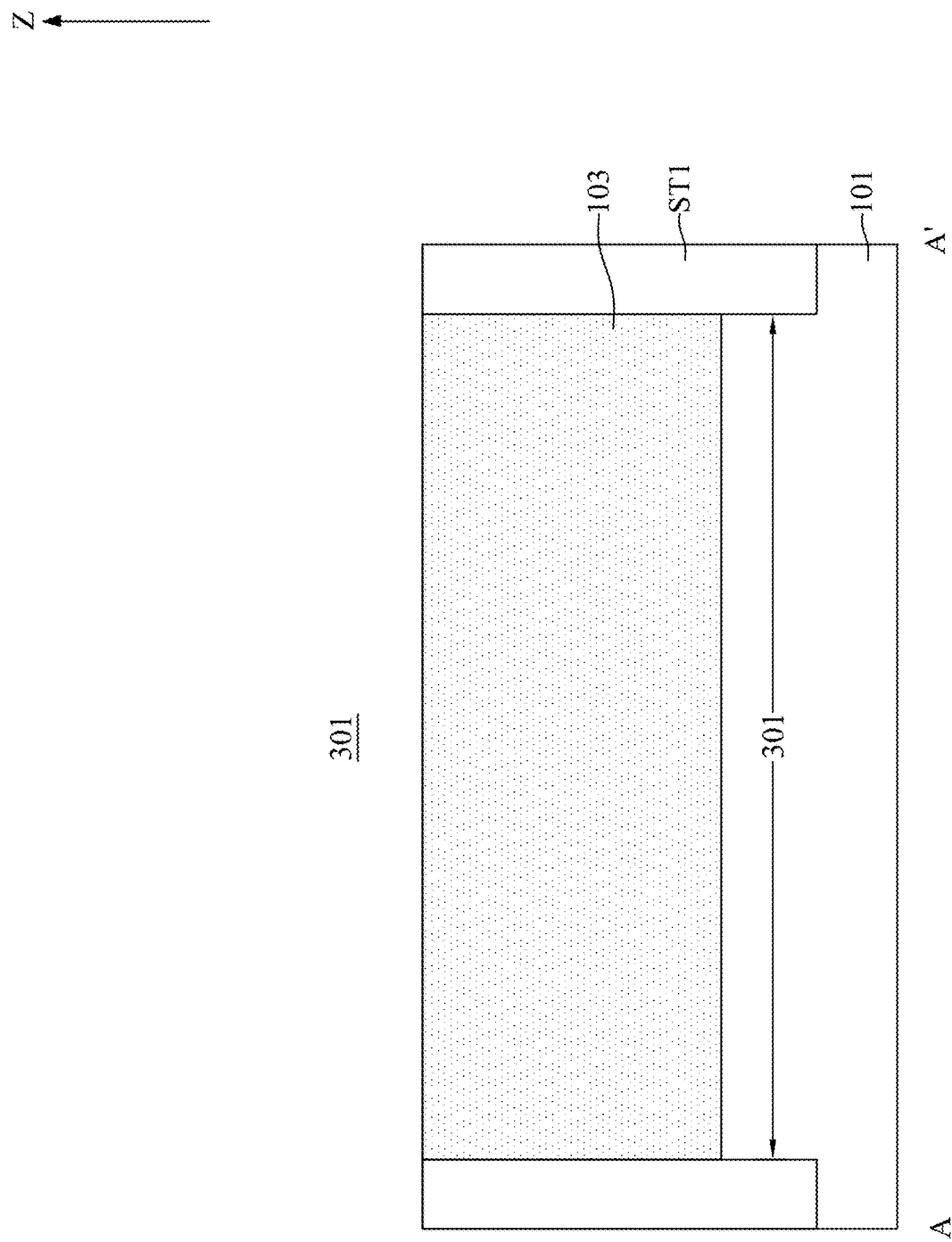
FIG. 5 is a schematic cross-sectional view diagram taken along a line A-A' in FIG. 4.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2. FIG. 4 illustrates, in a schematic top-view diagram, an intermediate semiconductor device in accordance with one embodiment of the present disclosure. FIG. 5 is a schematic cross-sectional view diagram taken along a line A-A' in FIG. 4.

With reference to FIGS. 1 to 5, at step S11, a substrate 101 may be provided and a first well layer 103 may be formed in the substrate 101.

With reference to FIGS. 2 and 3, the substrate 101 may include a first well region 301. For example, the first well region 301 may be a rectangular area of the substrate 101 in a top-view perspective. It should be noted that the first well region 301 may comprise a portion of the substrate 101 and a space above the portion of the substrate 101. Describing an element as being disposed on the first well region 301 means that the element is disposed on a top surface of the portion of the substrate 101. Describing an element as being disposed in the first well region 301 means that the element is disposed in the portion of the substrate 101; however, a top surface of the element may be even with the top surface of the portion of the substrate 101. Describing an element as being disposed above the first well region 301 means that the element is disposed above the top surface of the portion of the substrate 101.

The substrate 101 may be a bulk semiconductor substrate. The bulk semiconductor substrate may be formed of, for example, an elementary semiconductor such as silicon or germanium or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIGS. 2 and 3, a mask layer (not shown) may be formed on the substrate 101 to expose the first well region 301. An implantation process may be performed to dope the first well region 301 with p-type dopants. The term "p-type dopant" refers to an impurity that when added to an intrinsic semiconductor material creates to deficiencies of valence electrons. In a silicon containing semiconductor material, examples of p-type dopants include, but are not limited to, boron, aluminum, gallium or indium. After the implantation process, the first well layer 103 may be formed in the first well region 301. The first well layer 103 may have a first electrical type.

With reference to FIGS. 4 and 5, an isolation layer STI may be formed in the substrate 101. A series of deposition processes may be performed to deposit a pad oxide layer (not shown) and a pad nitride layer (not shown) on the substrate 101 to cover an active region 303. The active region 303 may be less than the first well region 301 in a top-view perspective. An etch process, such as an anisotropic dry etch process, may be performed to form trenches penetrating through the pad oxide layer, the pad nitride layer, and the substrate 101. Portions of the first well layer 103 may also be removed. An insulating material may be deposited into the trenches and a planarization process, such as chemical mechanical polishing, may be subsequently performed until the top surface of the substrate 101 is exposed to remove excess filling material, provide a substantially flat surface for subsequent processing steps, and concurrently form the isolation layer STI. The insulating material may be, for example, silicon oxide, silicon nitride, silicon oxynitride, silicon nitride oxide, or fluoride-doped silicate. The isolation layer STI may surround the active region 303.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 6:
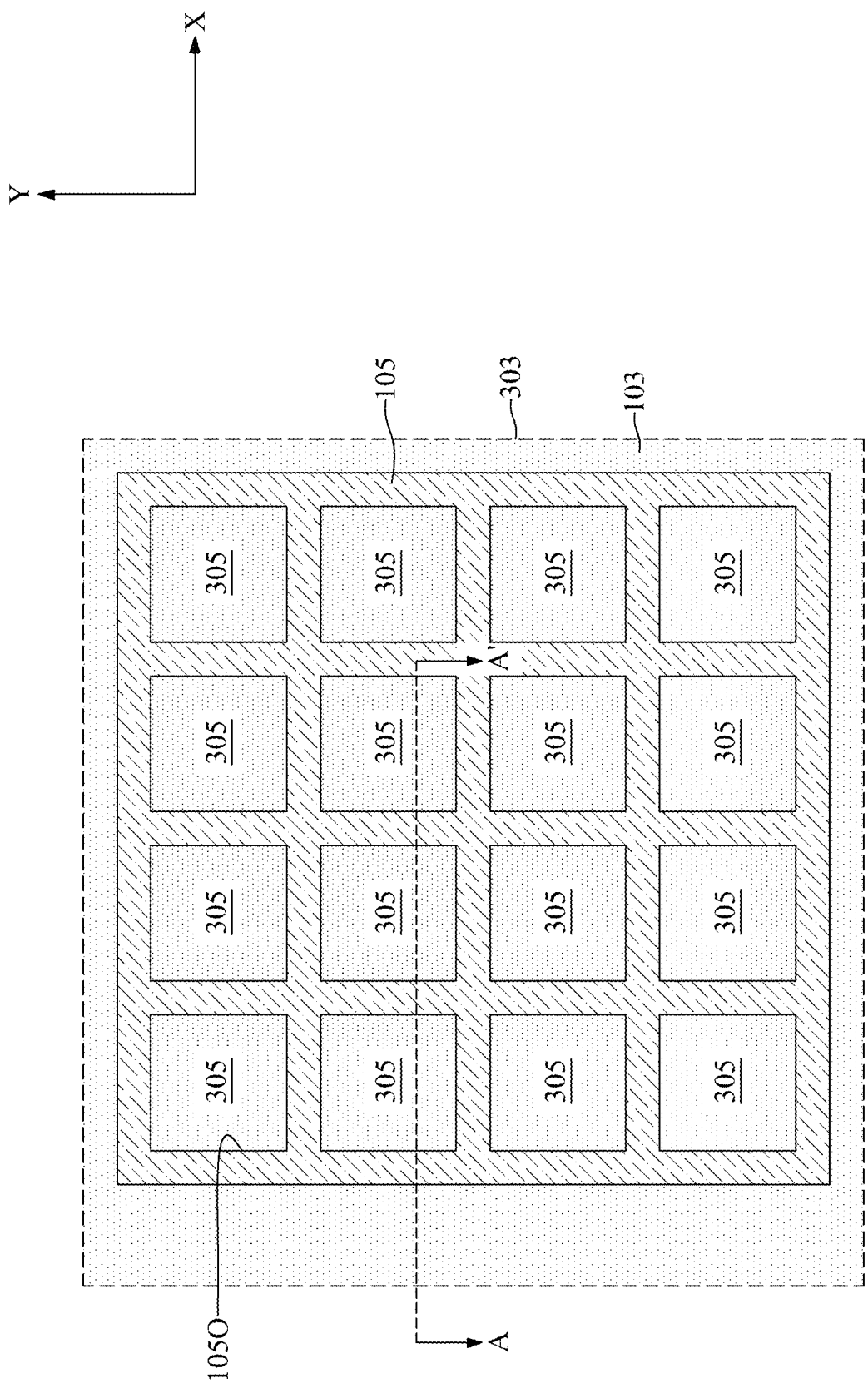
FIG. 6 illustrates, in a schematic top-view diagram, an intermediate semiconductor device in accordance with one embodiment of the present disclosure.
Figure 7:
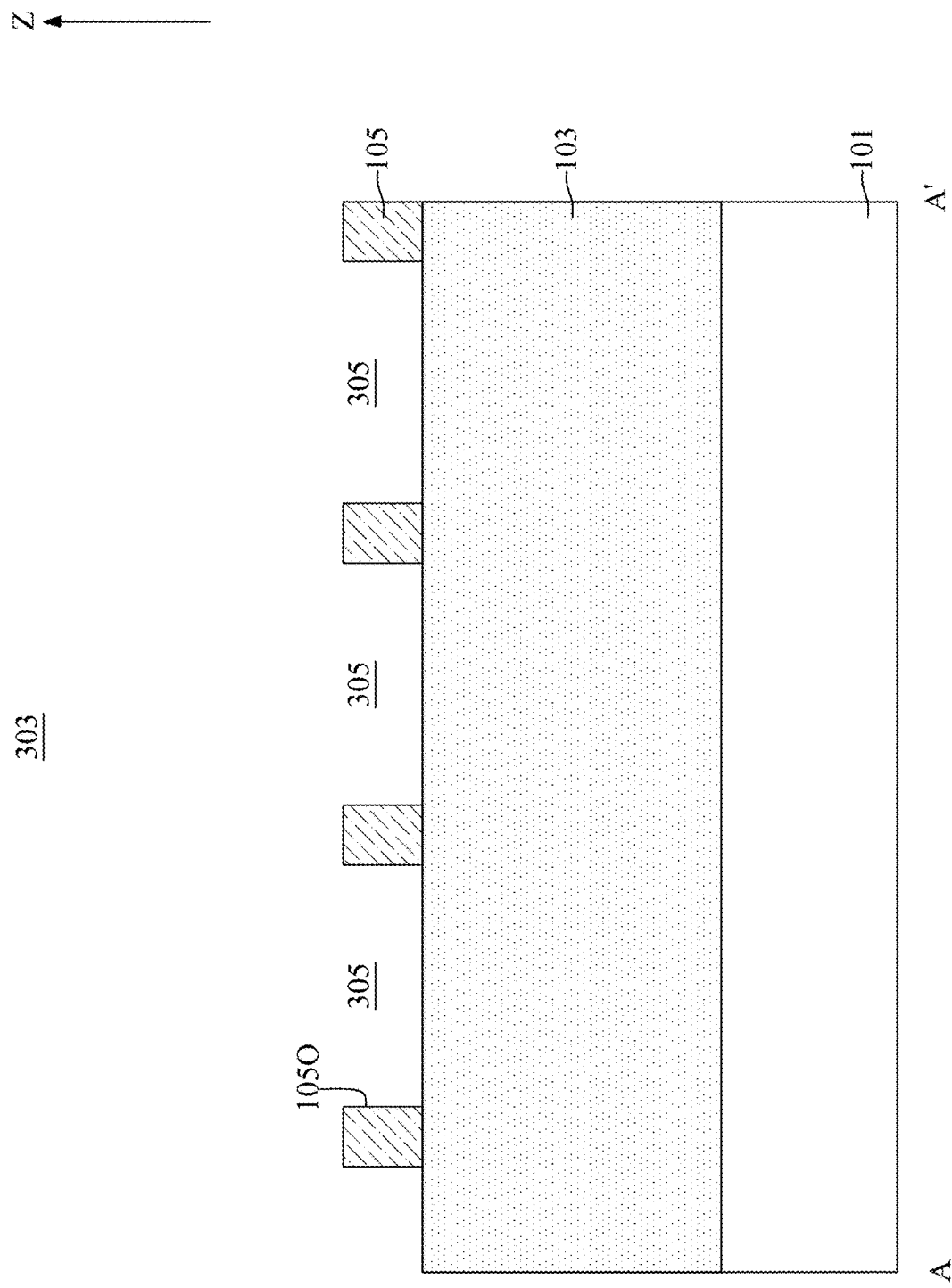
FIG. 7 is a schematic cross-sectional view diagram taken along a line A-A' in FIG. 6.

FIG. 6 illustrates, in a schematic top-view diagram, an intermediate semiconductor device in accordance with one embodiment of the present disclosure. FIG. 7 is a schematic cross-sectional view diagram taken along a line A-A' in FIG. 6.

With reference to FIGS. 1, 6, and 7, at step S13, an isolation-mask layer 105 may be formed on the first well layer 103 and mask openings 1050 may be formed along the isolation-mask layer 105 to define programmable regions 305.

With reference to FIGS. 6 and 7, the isolation-mask layer 105 may be formed on the active region 303. A photolithography process and a subsequent etch process may be performed to form mask openings 1050 along the isolation-mask layer 105. The mask openings 1050 may define the programmable regions 305. The programmable regions 305 are places for fabricating programmable units of a programmable array as will be illustrated later. Each of the programmable regions 305 may comprise a portion of the first well layer 103 and a space above the portion of the first well layer 103. Portions of the top surface of the first well layer 103 may be exposed through the mask openings 1050. The boundary of the isolation-mask layer 105 may define a total area of the programmable array. In the present embodiment, the isolation-mask layer 105 and the mask openings 1050 may have a grid pattern, which have four rows and four columns of the programmable regions 305, in a top-view perspective. It should be noted that the number of the programmable regions 305 may be adjust depending on the desire circumstances.

With reference to FIGS. 4 to 7, the isolation layer STI may only formed outside of the active region 303. As a result, a large amount of space can be used to form the programmable array.

In some embodiments, the isolation-mask layer 105 may be formed of, for example, a material different from first insulating layers 111 as will be illustrated later. In some embodiments, the isolation-mask layer 105 may be formed of, for example, silicon nitride, silicon oxynitride, or silicon nitride oxide. In some embodiments, the isolation-mask layer 105 may be formed of silicon nitride.

In some embodiments, the isolation-mask layer 105 may be formed of, for example, a carbon film. The terms "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

The carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$), or a combination thereof.

In some embodiments, the carbon film may be deposited from the processing gas mixture by maintaining a substrate temperature between about 100° C. and about 700° C.; specifically, between about 350° C. and about 550° C. In some embodiments, the carbon film may be deposited from the processing gas mixture by maintaining a chamber pressure between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance property, and reflectivity. In some embodiments, a mixture of reactive gases and inert gases may be added to the processing gas mixture to deposit the carbon film.

The carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch resistance property and chemical mechanical polishing resistance property.

Figure 8:
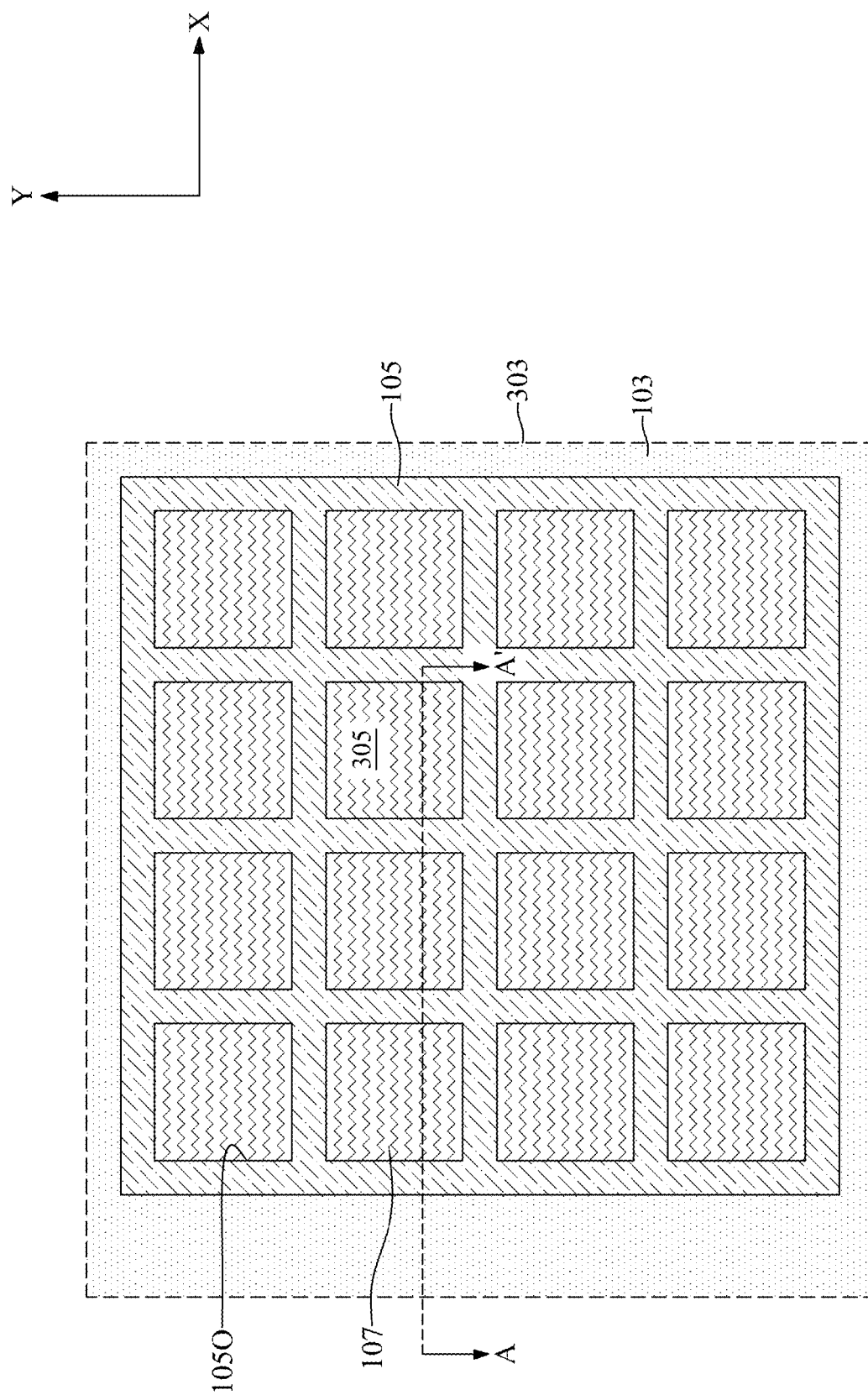
FIG. 8 illustrates, in a schematic top-view diagram, an intermediate semiconductor device in accordance with one embodiment of the present disclosure.
Figure 9:
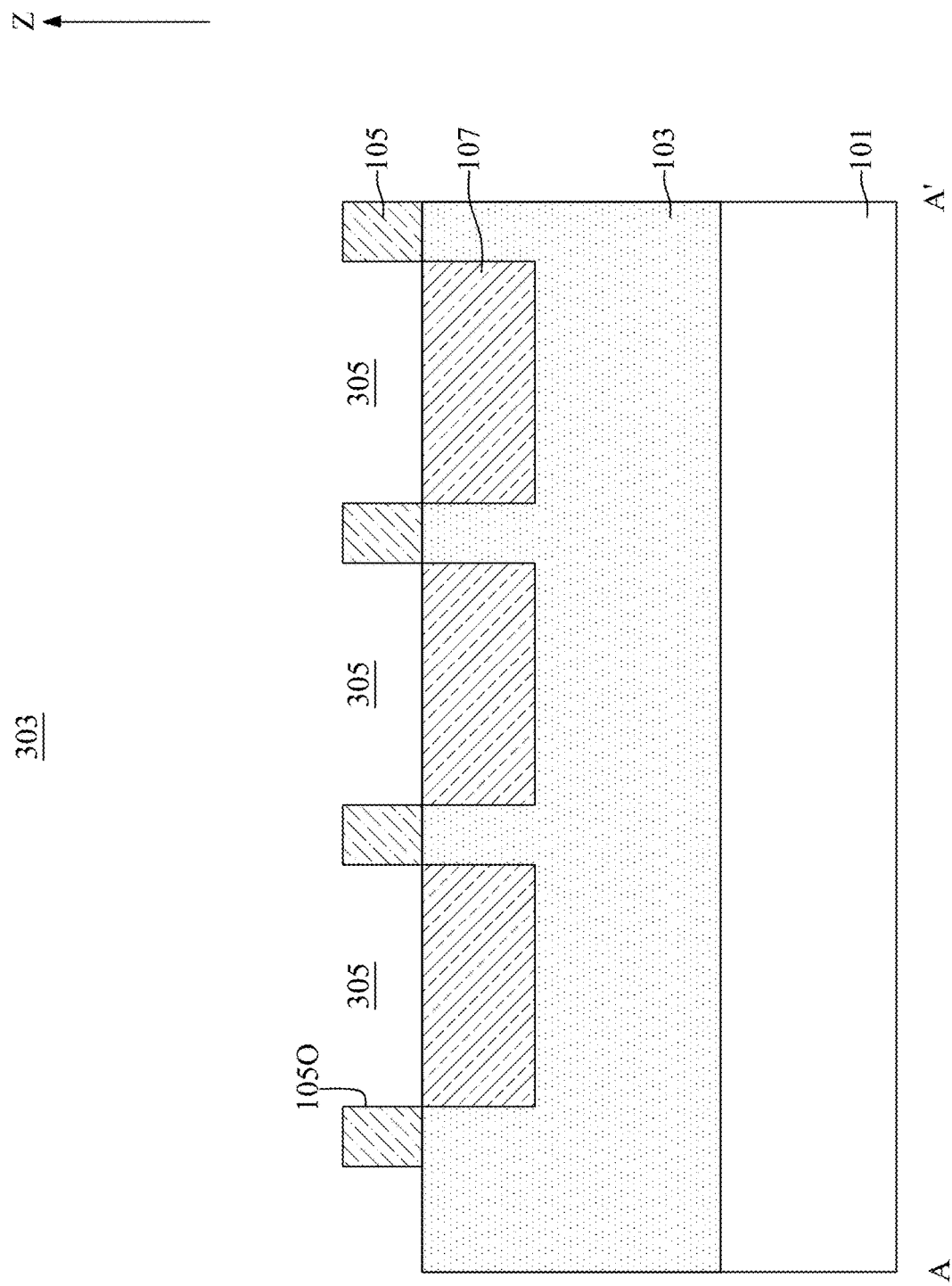
FIG. 9 is a schematic cross-sectional view diagram taken along a line A-A' in FIG. 8.
Figure 10:
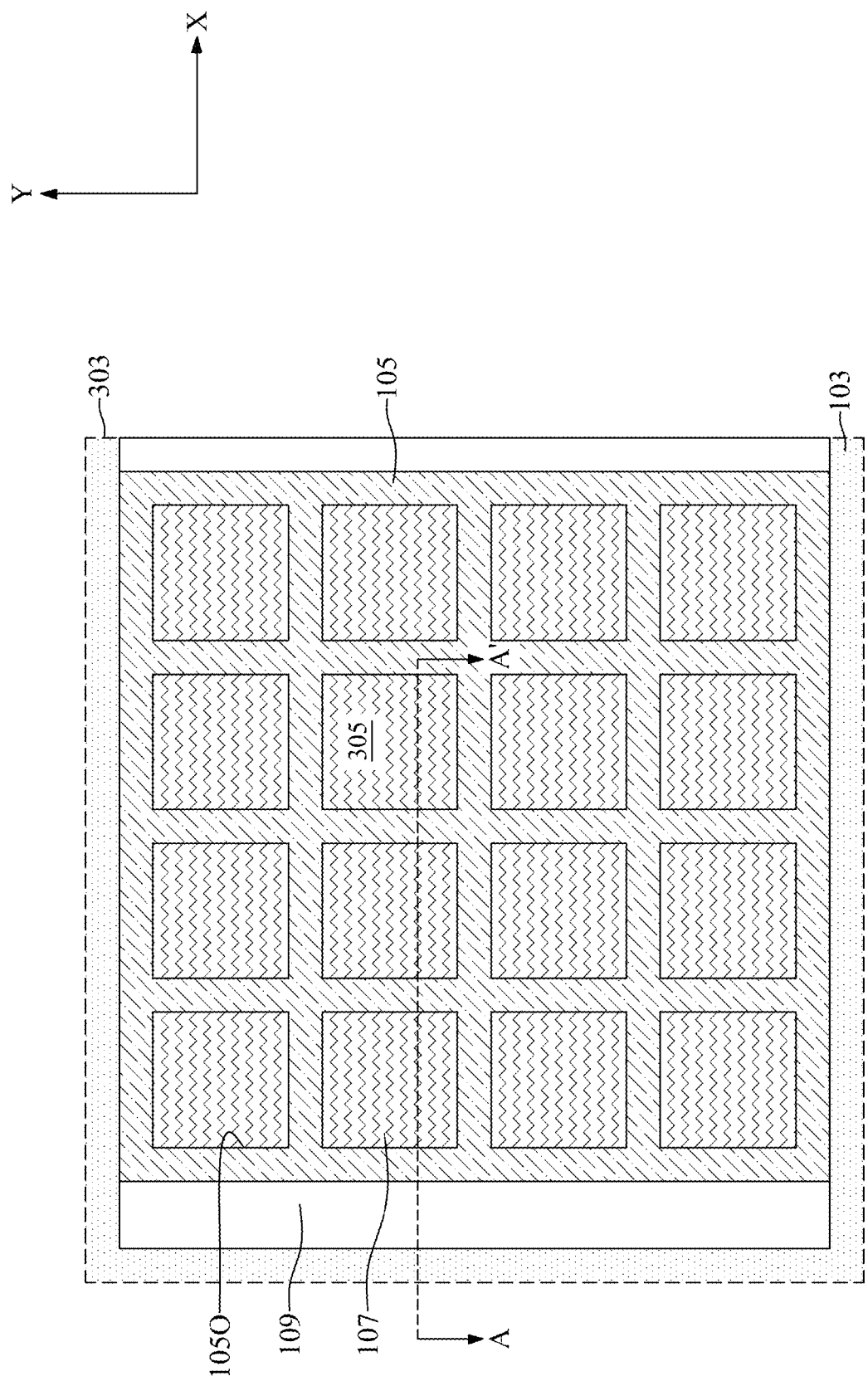
FIG. 10 illustrates, in a schematic top-view diagram, an intermediate semiconductor device in accordance with one embodiment of the present disclosure.
Figure 11:
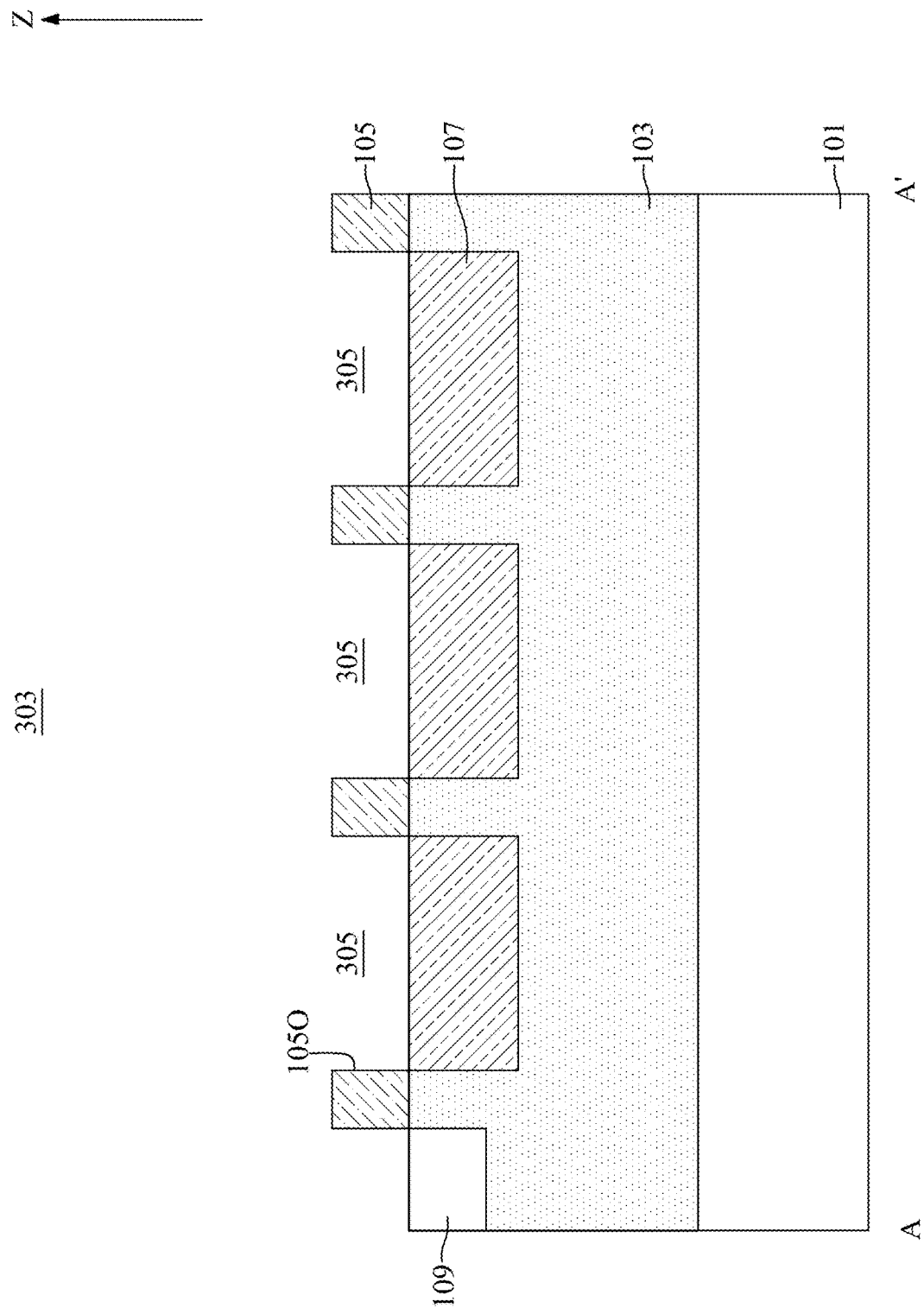
FIG. 11 is a schematic cross-sectional view diagram taken along a line A-A' in FIG. 10.

FIG. 8 illustrates, in a schematic top-view diagram, an intermediate semiconductor device in accordance with one embodiment of the present disclosure. FIG. 9 is a schematic cross-sectional view diagram taken along a line A-A' in FIG. 8. FIG. 10 illustrates, in a schematic top-view diagram, an intermediate semiconductor device in accordance with one embodiment of the present disclosure. FIG. 11 is a schematic cross-sectional view diagram taken along a line A-A' in FIG. 10.

With reference to FIG. 1 and FIGS. 8 to 11, at step S15, bottom conductive layers 107 may be formed in the first well layer 103 and two bias layers 109 may be formed in the first well layer 103 and spaced apart from the bottom conductive layers 107.

With reference to FIGS. 8 and 9, an implantation process may be performed to form the bottom conductive layers 107 in the programmable regions 305. In other words, the bottom conductive layers 107 may be formed in the first well layer 103. In some embodiments, the implantation process may be performed with a mask layer (not shown) that covers the area out of the active region 303. The mask layer may be removed after the formation of the bottom conductive layers 107. The implantation process may be performed using n-type dopants. The term "n-type dopant" refers to an impurity that when added to an intrinsic semiconductor material contributes free electrons to the intrinsic semiconductor material. In a silicon containing material, examples of n-type dopants include, but are not limited to, antimony, arsenic or phosphorus. That is, the bottom conductive layers 107 may have a second electrical type opposite to the first electrical type. A depth of the bottom conductive layers 107 may be between about 0.24 micrometer and about 0.26 micrometer. The dopant concentration of the bottom conductive layers 107 may be between about 4E20 atoms/cm^3 to 2E21 atoms/cm^3. In the present embodiments, the interfaces between the bottom conductive layers 107 and the first well layer 103 may be referred to as P-N junctions.

Baseline voltages may be applied to the bottom conductive layers 107 during programming procedures. The value of the baseline voltages may be, for example, 0 volts, 3 volts, 4 volts, 5 volts, or any number between 0 volts and 5 volts.

With reference to FIGS. 10 and 11, an implantation process may be performed to form the two bias layers 109 in the first well layer 103. In some embodiments, a mask layer (not shown) may be formed to cover the isolation-mask layer 105 and the programmable regions 305 during the implantation process. In a top-view perspective, the two bias layers 109 may be at two sides of the isolation-mask layer 105. Each of the two bias layers 109 may be spaced apart from the bottom conductive layers 107 with the isolation-mask layer 105 interposed therebetween. In a cross-sectional perspective, the depth of the two bias layers 109 may be shallower than the depth of the bottom conductive layers 107. The implantation process may be performed using p-type dopants. The two bias layers 109 may have the first electrical type. The dopant concentration of the two bias layers 109 may be greater than the dopant concentration of the first well layer 103. For example, the dopant concentration of the two bias layers 109 may be between about 4E20 atoms/cm^3 to 2E21 atoms/cm^3.

Biased voltages may be applied to the two bias layers 109. The value of biased voltages may be less than the value of the baseline voltages. For example, the value of the biased voltages may be, for example, −1 volts, −2 volts, −3 volts, or any number between −0.5 volts and −3 volts. Depletion regions (not shown) may be formed surrounding the bottom conductive layers 107 when the biased voltages are applied to the two bias layers 109 and the baseline voltages are applied to the bottom conductive layers 107. The depletion regions may serve as electrical isolation for the bottom conductive layers 107.

Figure 12:
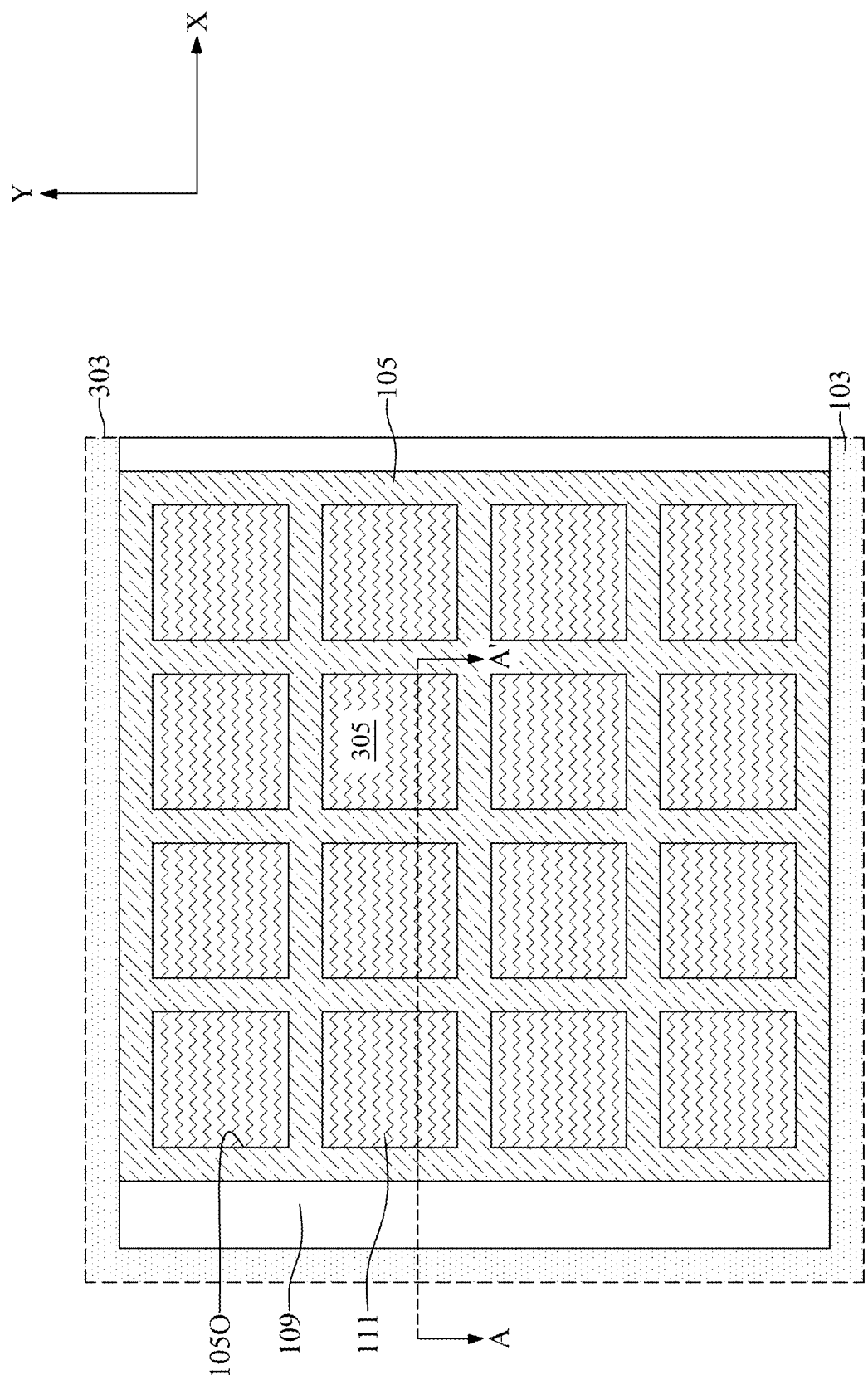
FIG. 12 illustrates, in a schematic top-view diagram, an intermediate semiconductor device in accordance with one embodiment of the present disclosure.
Figure 13:
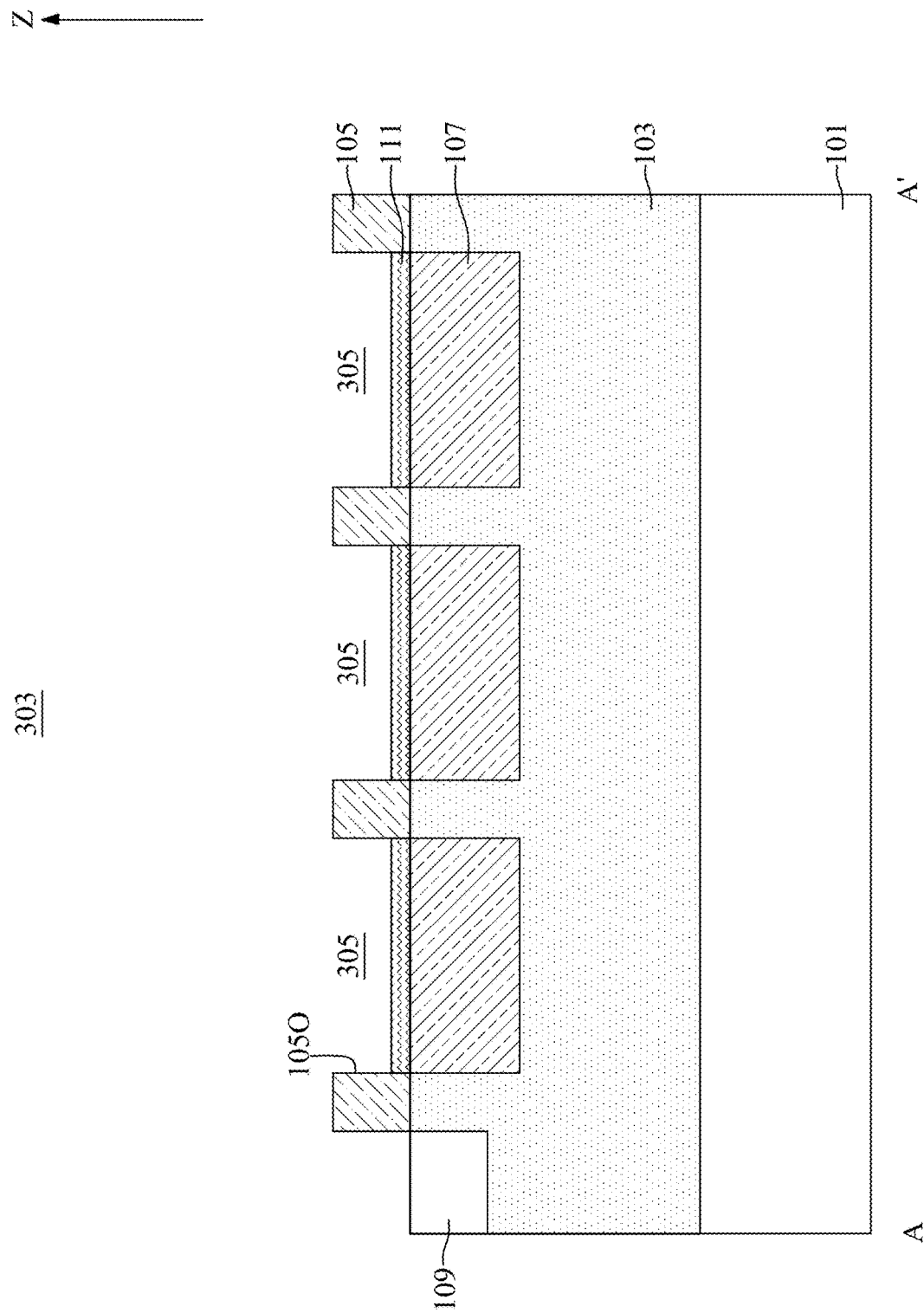
FIG. 13 is a schematic cross-sectional view diagram taken along a line A-A' in FIG. 12.

FIG. 12 illustrates, in a schematic top-view diagram, an intermediate semiconductor device in accordance with one embodiment of the present disclosure. FIG. 13 is a schematic cross-sectional view diagram taken along a line A-A' in FIG. 12.

With reference to FIG. 1 and FIGS. 12 and 13, at step S17, first insulating layers 111 may be formed on the bottom conductive layers 107.

With reference to FIGS. 12 and 13, first insulating layers 111 may be formed on the bottom conductive layers 107. Any two adjacent first insulating layers 111 may be isolated by the isolation-mask layer 105. In some embodiments, the first insulating layers 111 may be formed of, a material different from the isolation-mask layer 105. All of the first insulating layers 111 may have a same thickness. The thickness of the first insulating layers 111 may be between about 30 angstroms and about 70 angstroms.

In some embodiments, the first insulating layers 111 may be formed by, for example, thermal oxidation. The first insulating layers 111 may be formed of, for example, silicon oxide. The two bias layers 109 may be masked during the formation of the first insulating layers 111.

In some embodiments, the first insulating layers 111 may be formed of a high-k material, an oxide, a nitride, an oxynitride or combinations thereof. The high-k material may include a hafnium-containing material. The hafnium-containing material may be, for example, a hafnium oxide, a hafnium silicon oxide, a hafnium silicon oxynitride or combinations thereof. In some embodiments, the high-k material may be, for example, a lanthanum oxide, a lanthanum aluminum oxide, a zirconium oxide, a zirconium silicon oxide, a zirconium silicon oxynitride, an aluminum oxide and combinations thereof. Interfacial layers (not shown) may be formed between the first insulating layers 111 and the bottom conductive layers 107. The interfacial layer may have a thickness between about 7 angstroms and 12 angstroms. In some embodiments, the interfacial layer may have a thickness between about 8 angstroms and 10 angstroms.

Figure 14:
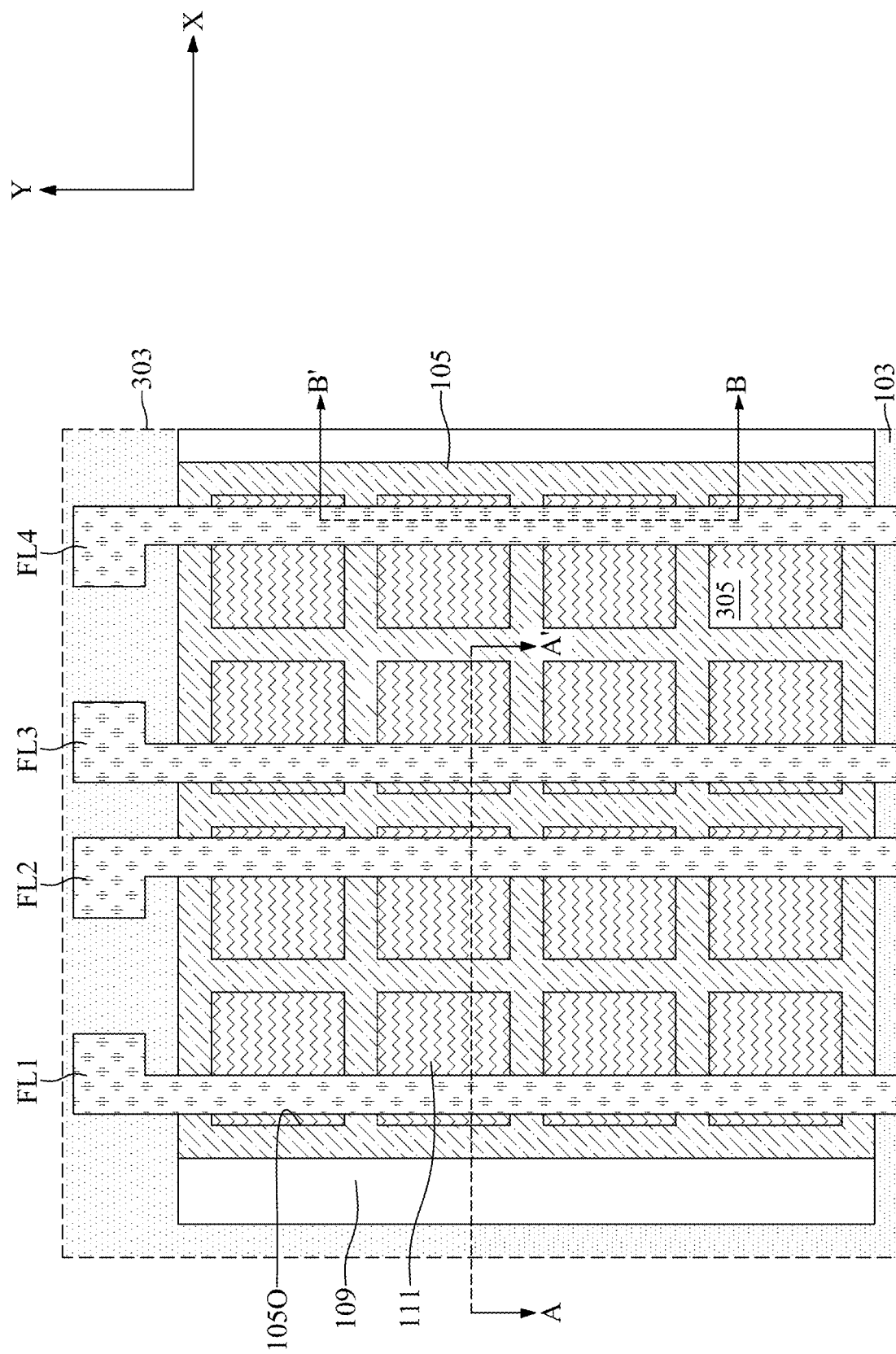
FIG. 14 illustrates, in a schematic top-view diagram, an intermediate semiconductor device in accordance with one embodiment of the present disclosure.
Figure 15:
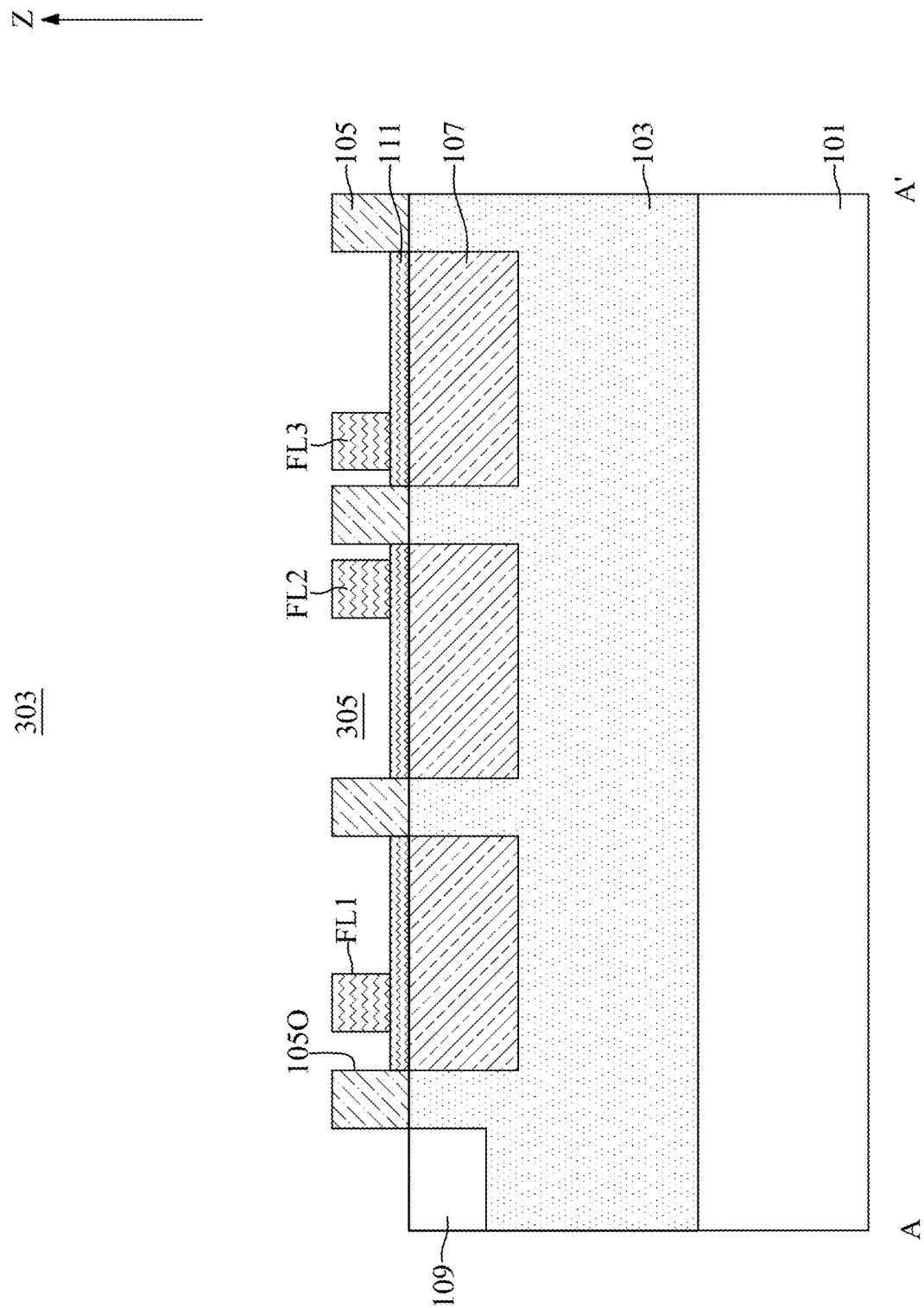
FIGS. 15 and 16 are schematic cross-sectional view diagrams taken along a line A-A' and a line B-B' in FIG. 14.
Figure 16:
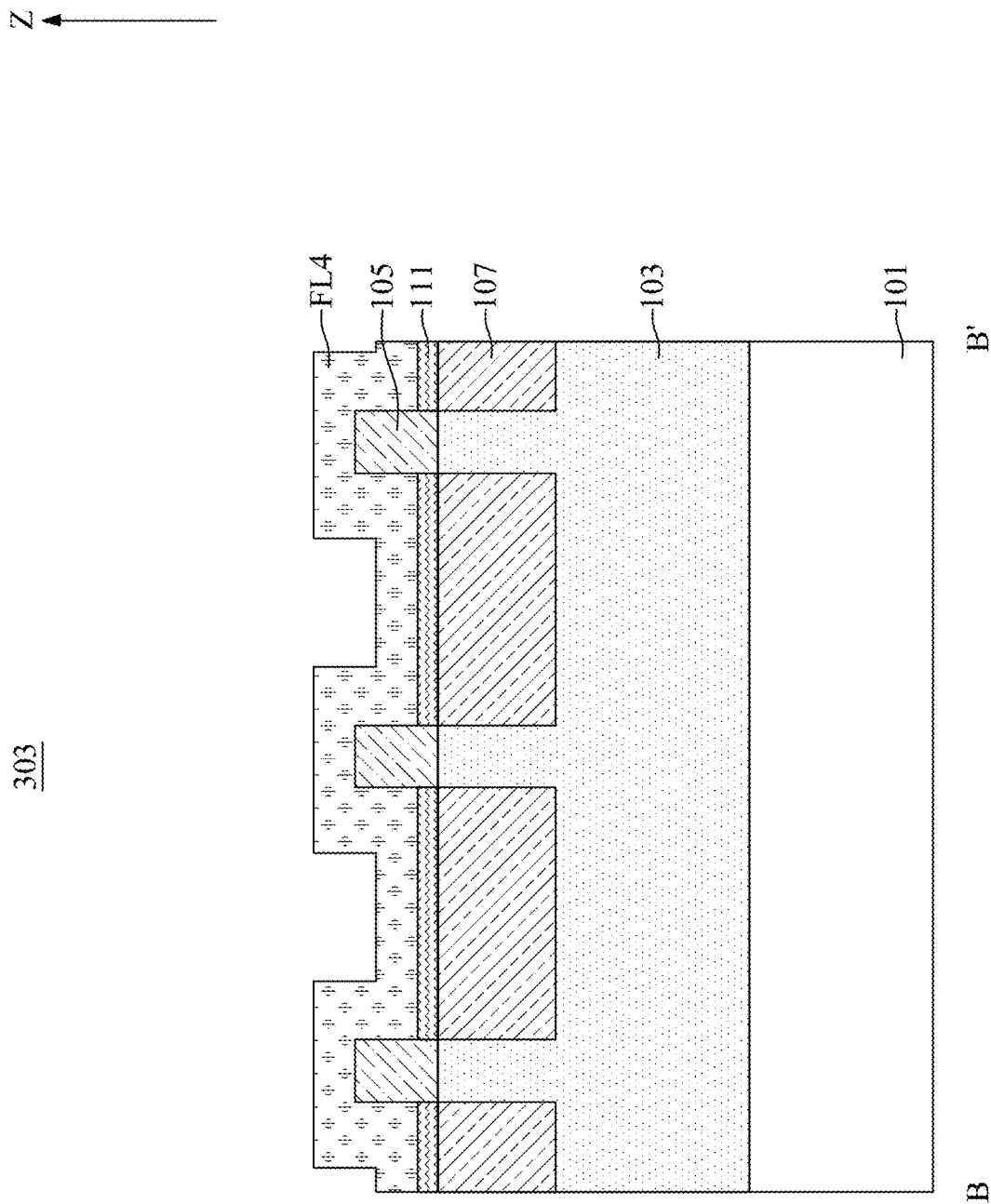
Figure 17:
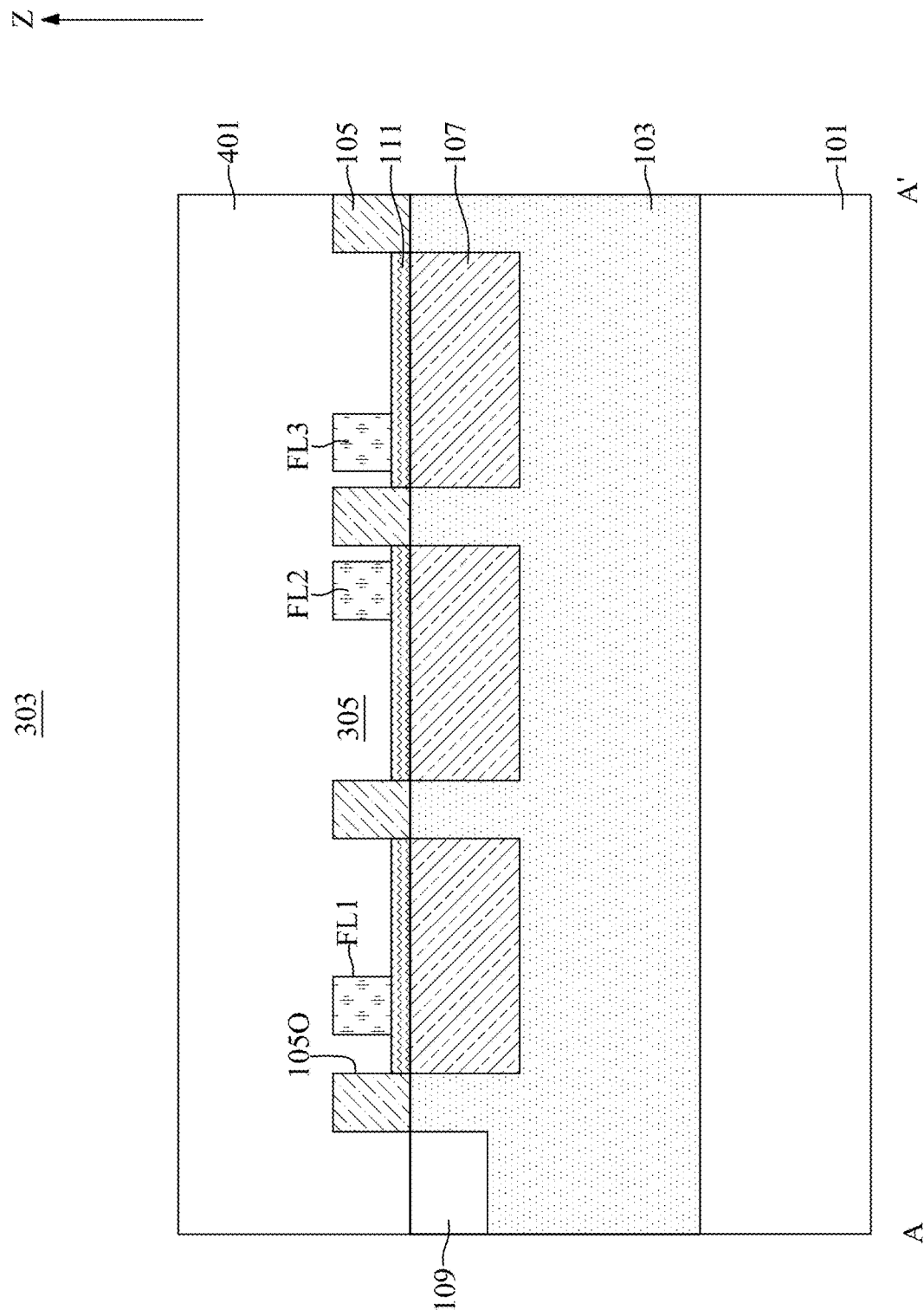
FIGS. 17 and 18 are schematic cross-sectional view diagrams taken along a line A-A' and a line B-B' in FIG. 14.
Figure 18:
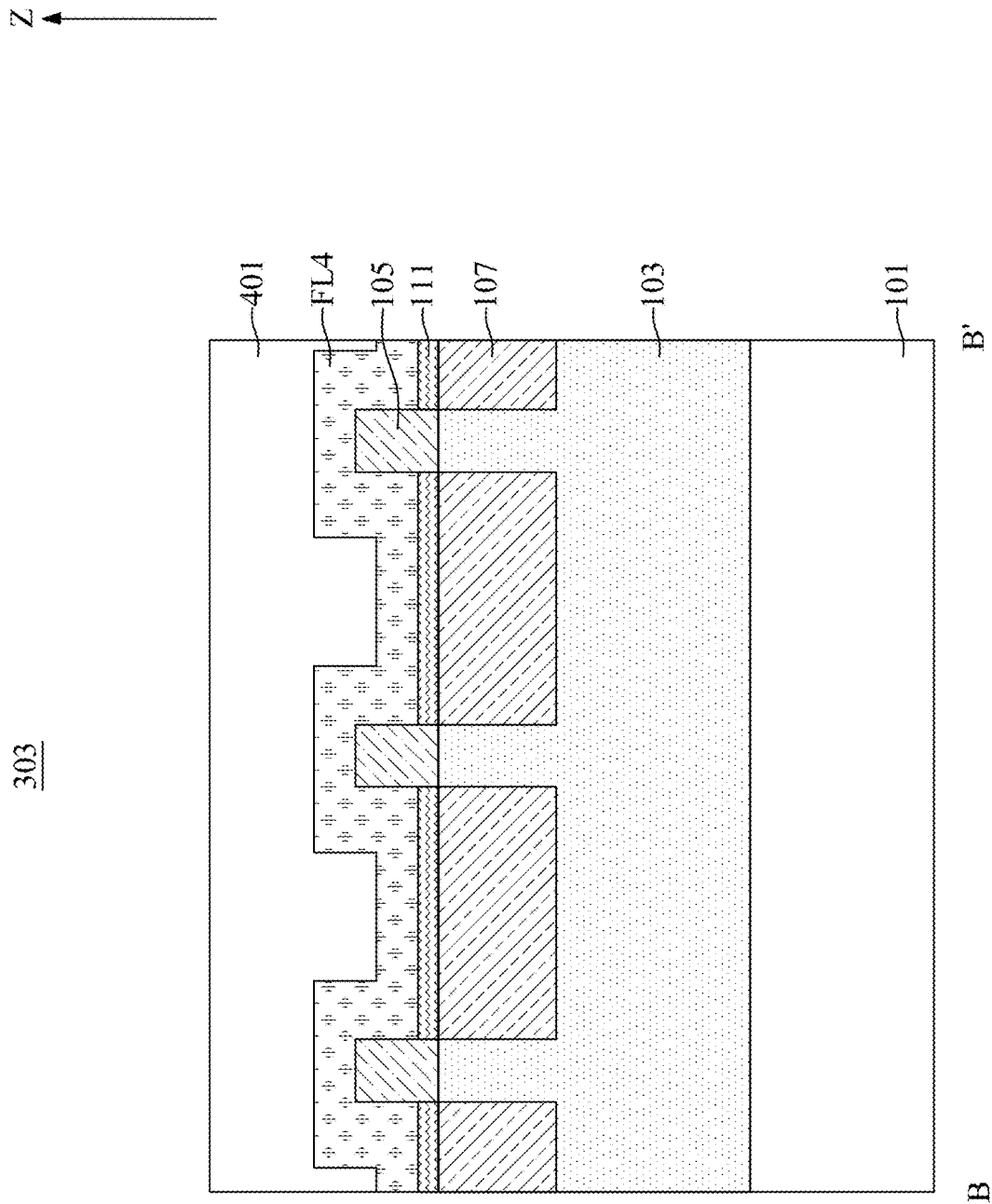

FIG. 14 illustrates, in a schematic top-view diagram, an intermediate semiconductor device in accordance with one embodiment of the present disclosure. FIGS. 15 and 16 are schematic cross-sectional view diagrams taken along a line A-A' and a line B-B' in FIG. 14. FIGS. 17 and 18 are schematic cross-sectional view diagrams taken along a line A-A' and a line B-B' in FIG. 14.

With reference to FIG. 1 and FIGS. 14 to 18, at step S19, first conductive lines FL1, FL2, FL3, FL4 may be formed on the first insulating layers 111.

With reference to FIGS. 14 to 16, the first conductive lines FL1, FL2, FL3, FL4 may be formed on the first insulating layers 111 and saddled on the isolation-mask layer 105 in a cross-sectional perspective. The isolation-mask layer 105 may provide electrical isolation for the first well layer 103 when programming voltages are applied to the first conductive lines FL1, FL2, FL3, FL4 during programming procedures to avoid the damage of the isolation structure (i.e., the P-N junctions formed from the interfaces between the bottom conductive layers 107 and the first well layer 103) for the bottom conductive layers 107. The programming voltages may be, for example, 5.5 volts, 6.0 volts, 6.5 volts, or any number between 5.2 volts and 6.5 volts.

In a top-view perspective, the first conductive lines FL1, FL2, FL3, FL4 may be parallel to each other and may extend along a first direction parallel to the y axis. Ends of the first conductive lines FL1, FL2, FL3, FL4 may be out of the boundary of the isolation-mask layer 105. In some embodiments, the distance between adjacent pairs of the first conductive lines may be different. In some embodiments, the distance between the adjacent pairs of the first conductive lines may be the same.

In some embodiments, the first conductive lines FL1, FL2, FL3, FL4 may be formed of, for example, polycrystalline silicon, polycrystalline silicon germanium, or a combination thereof. In some embodiments, the first conductive lines FL1, FL2, FL3, FL4 may be doped with dopants such as phosphorus, arsenic, antimony, or boron. In some embodiments, the first conductive lines FL1, FL2, FL3, FL4 may have the same electrical type as the bottom conductive layers 107.

In some embodiments, each of the first conductive lines FL1, FL2, FL3, FL4 may be a stacked layer structure. For example, each of the first conductive lines FL1, FL2, FL3, FL4 may be formed of a bottom layer and a top layer formed on the bottom layer. The bottom layer may be formed of, for example, polycrystalline silicon, polycrystalline silicon germanium, or a combination thereof. The top layer may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof.

The bottom conductive layers 107, the first insulating layers 111, and the first conductive lines FL1, FL2, FL3, FL4 together configure the programming units P01, P02 . . . , P16

Figure 26:
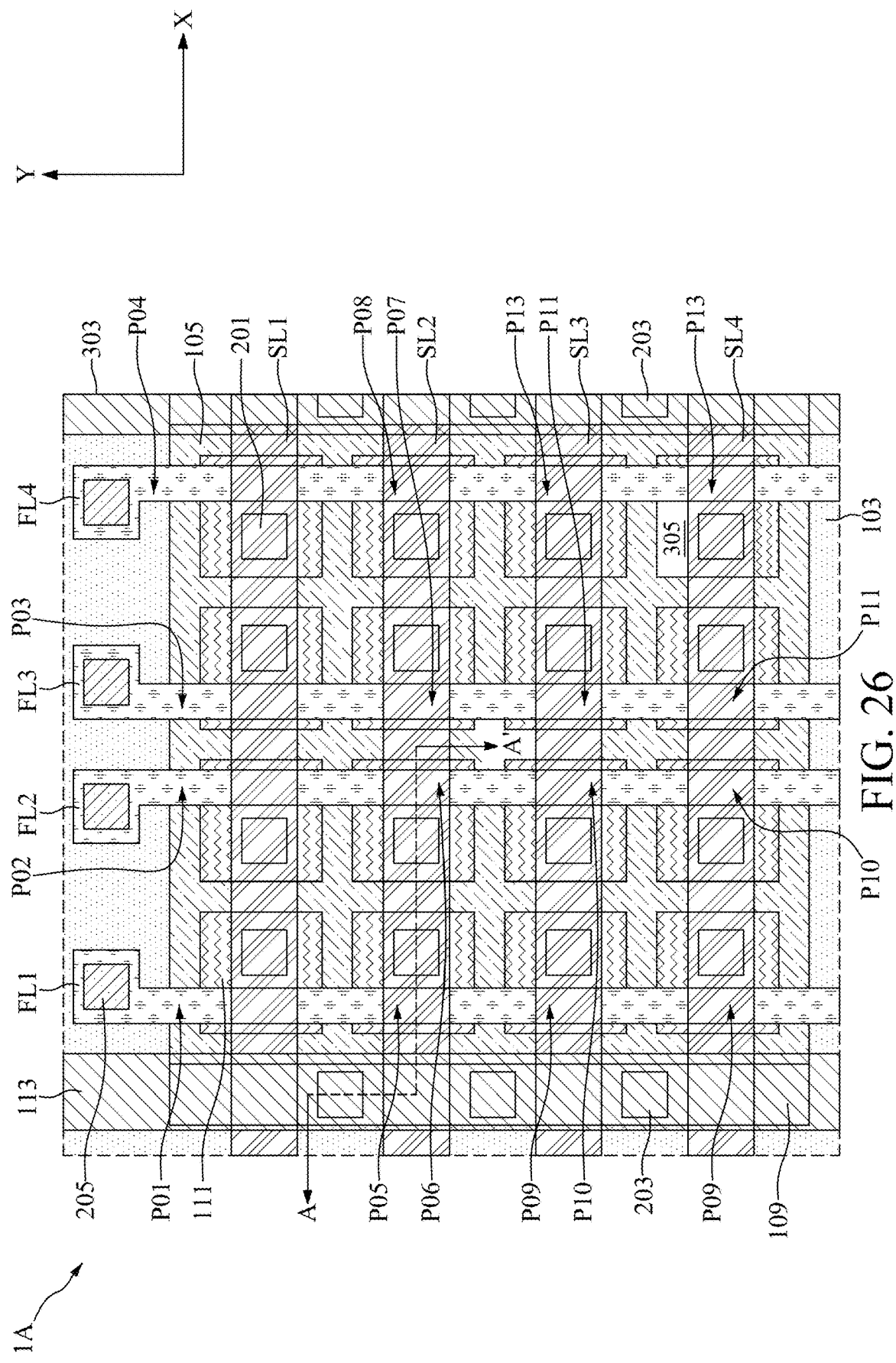
FIG. 26 illustrates, in a schematic top-view diagram, a semiconductor device in accordance with one embodiment of the present disclosure.
Figure 27:
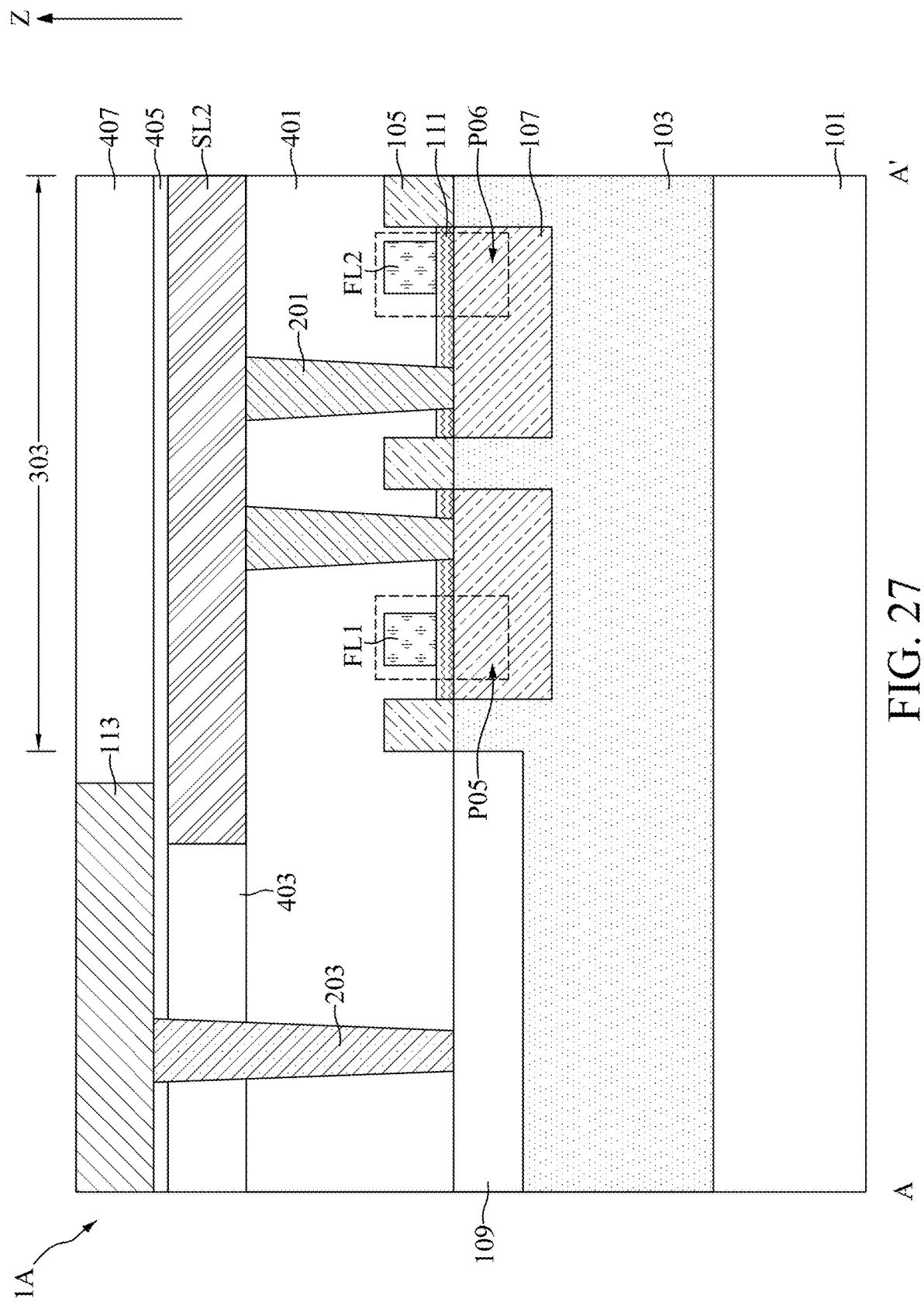
FIG. 27 is a schematic cross-sectional view diagram taken along a line A-A' in FIG. 26.

(as shown in FIGS. 26 and 27) in the programmable regions 305. The programming units P01, P02 . . . , P16 together configure the programming array.

With reference to FIGS. 17 and 18, an inter-layer dielectric 401 may be formed on the substrate 101 to cover the isolation-mask layer 105, the first insulating layers 111, and the first conductive lines FL1, FL2, FL3, FL4. A planarization process, such as chemical mechanical polishing, may be performed to provide a substantially flat surface for subsequent processing steps. The inter-layer dielectric 401 may be formed of, for example, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, porous polymeric material, or a combination thereof, but is not limited thereto. The inter-layer dielectric 401 may provide electrical isolation for the first conductive lines FL1, FL2, FL3, FL4 and structure support for the first conductive lines FL1, FL2, FL3, FL4 and the isolation-mask layer 105.

Figure 19:
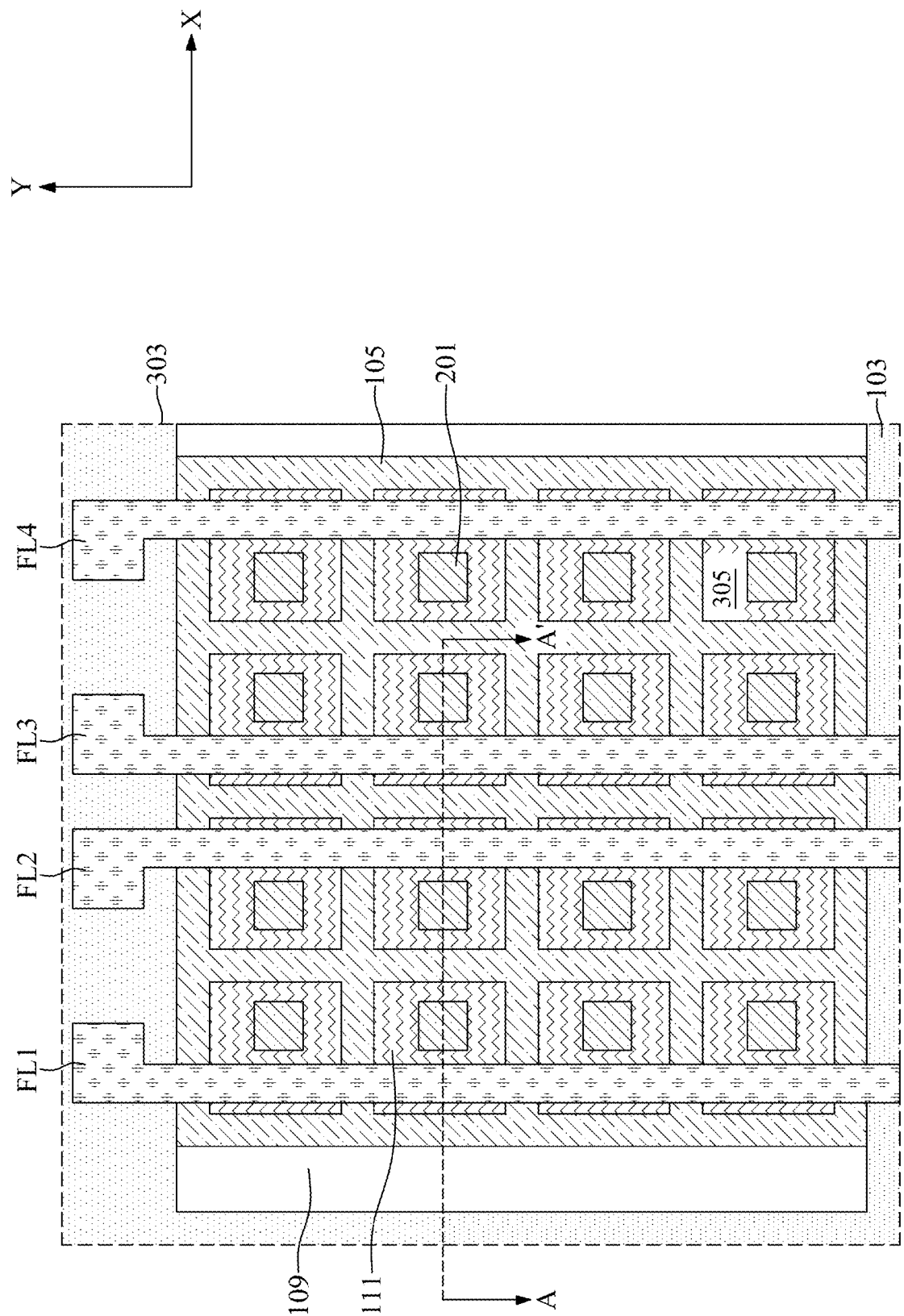
FIG. 19 illustrates, in a schematic top-view diagram, an intermediate semiconductor device in accordance with one embodiment of the present disclosure.
Figure 20:
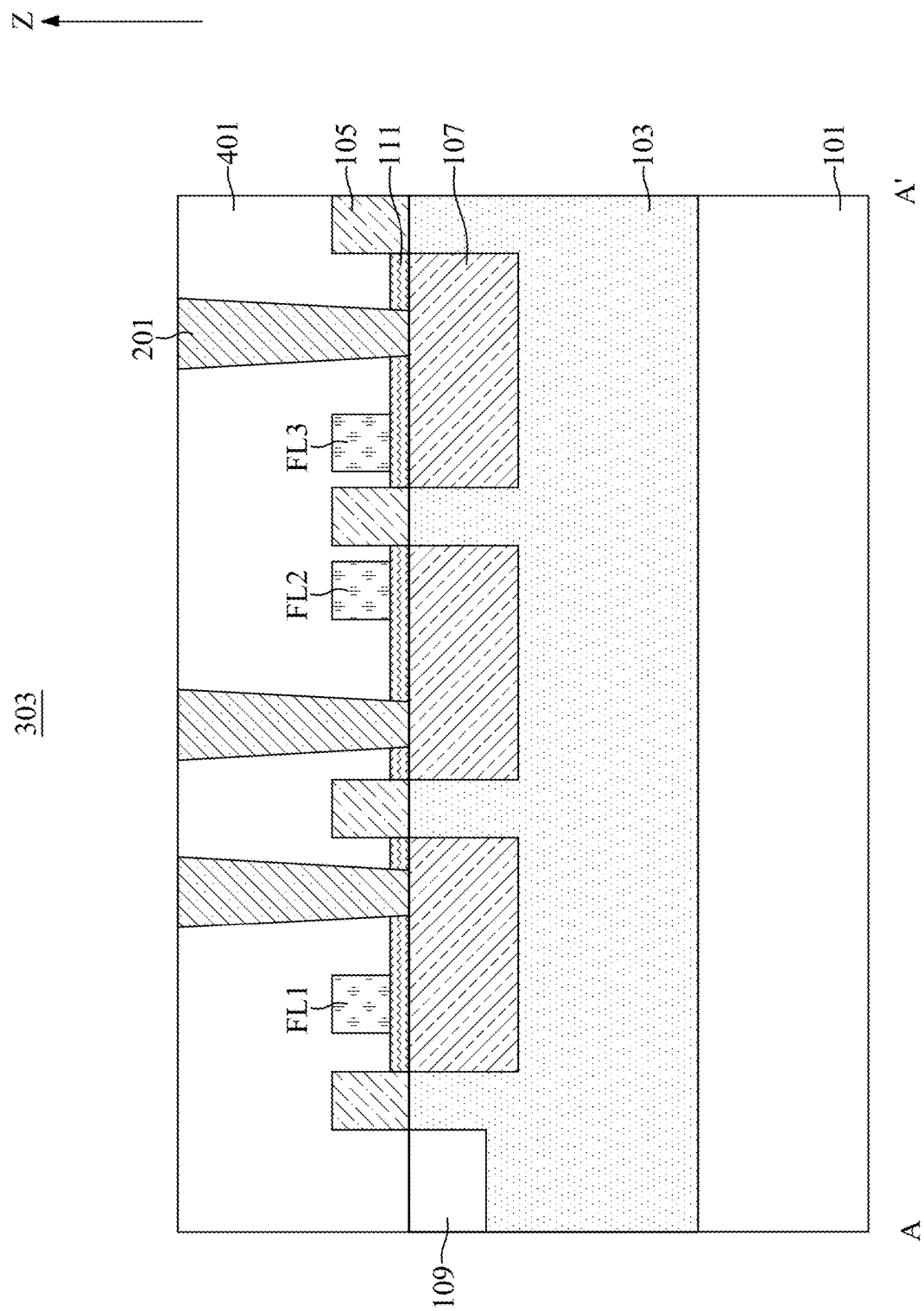
FIG. 20 is a schematic cross-sectional view diagram taken along a line A-A' in FIG. 19.
Figure 21:
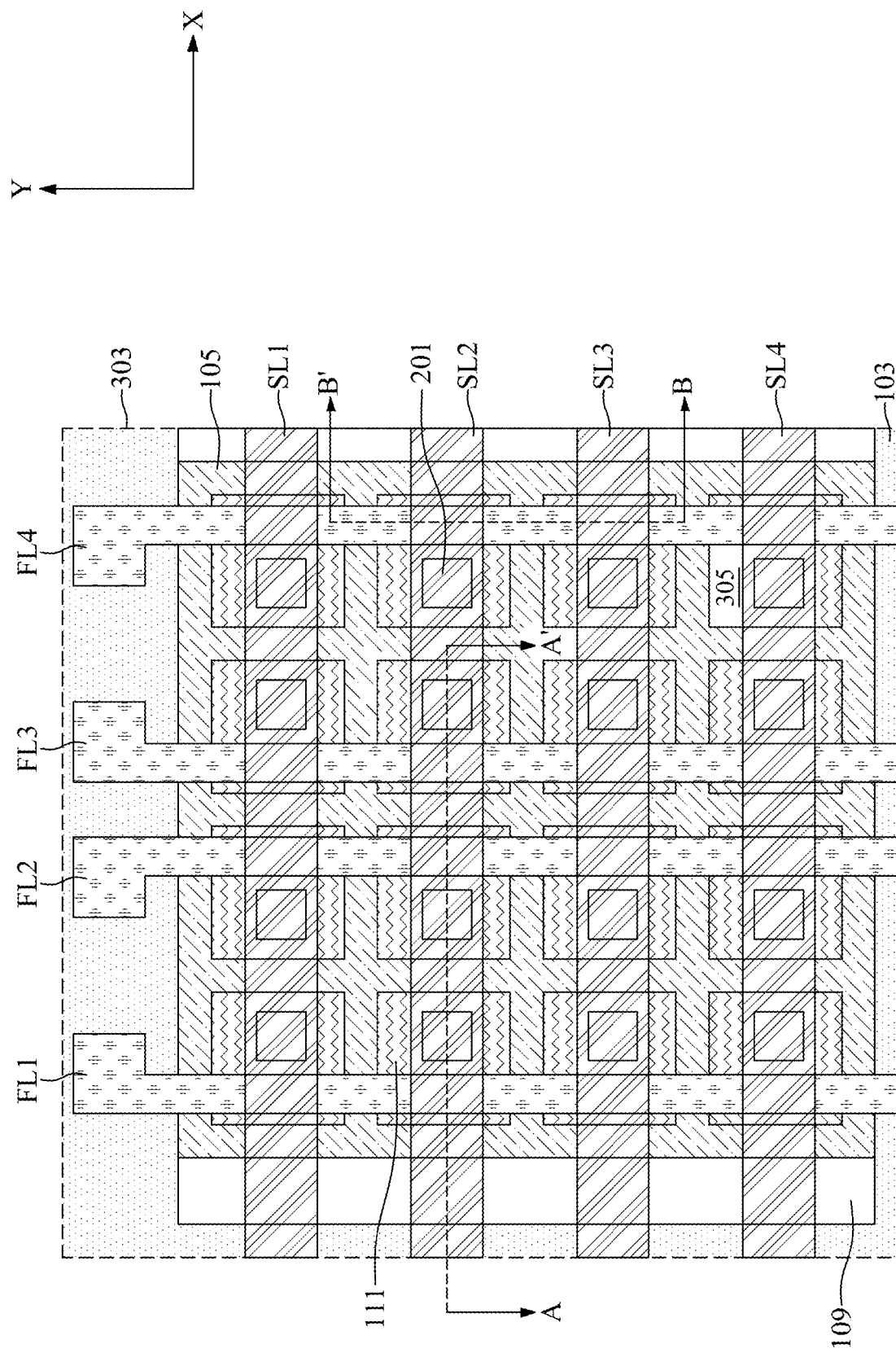
FIG. 21 illustrates, in a schematic top-view diagram, an intermediate semiconductor device in accordance with one embodiment of the present disclosure.
Figure 22:
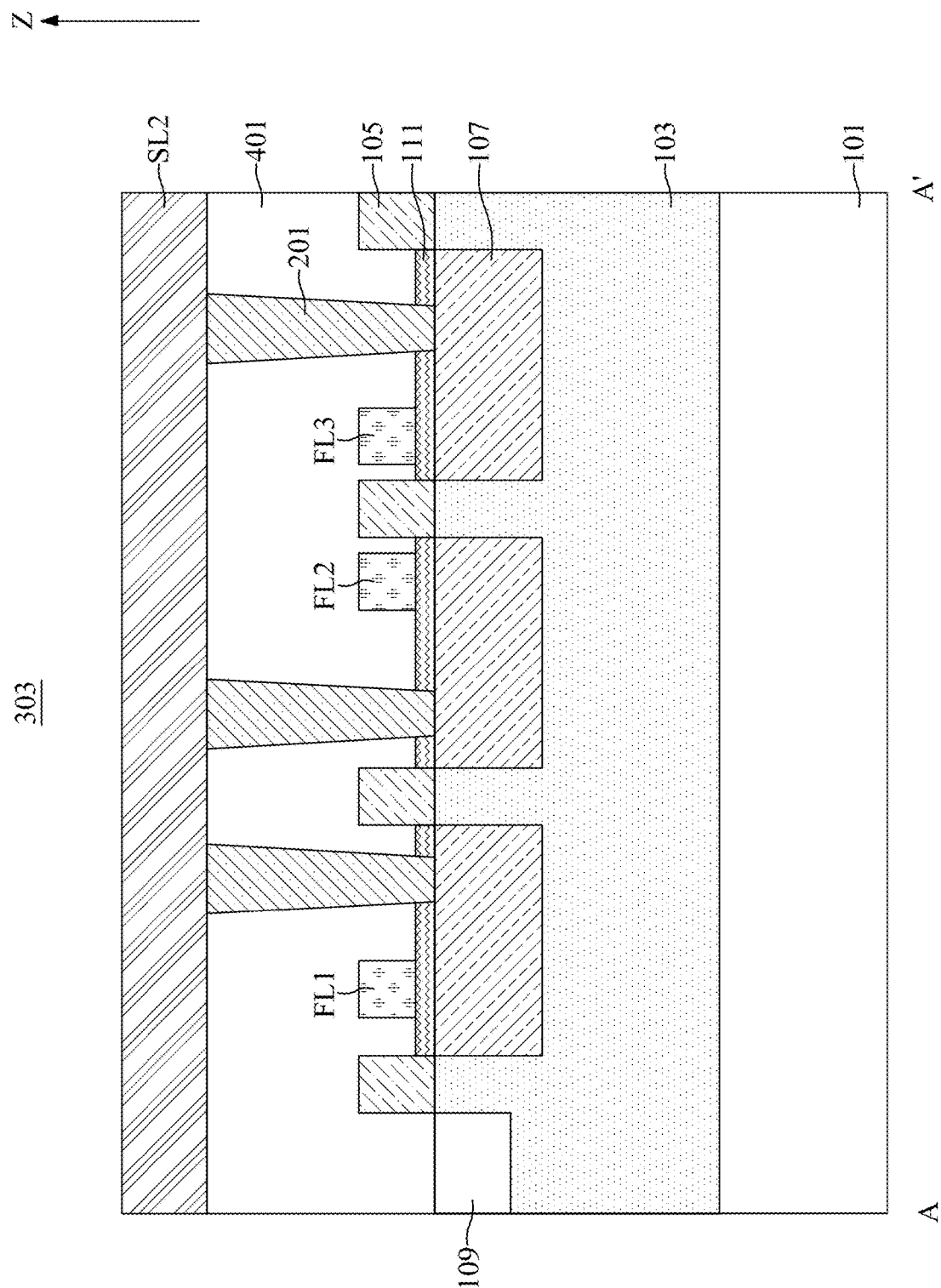
FIGS. 22 and 23 are schematic cross-sectional view diagrams taken along a line A-A' and a line B-B' in FIG. 14.
Figure 23:
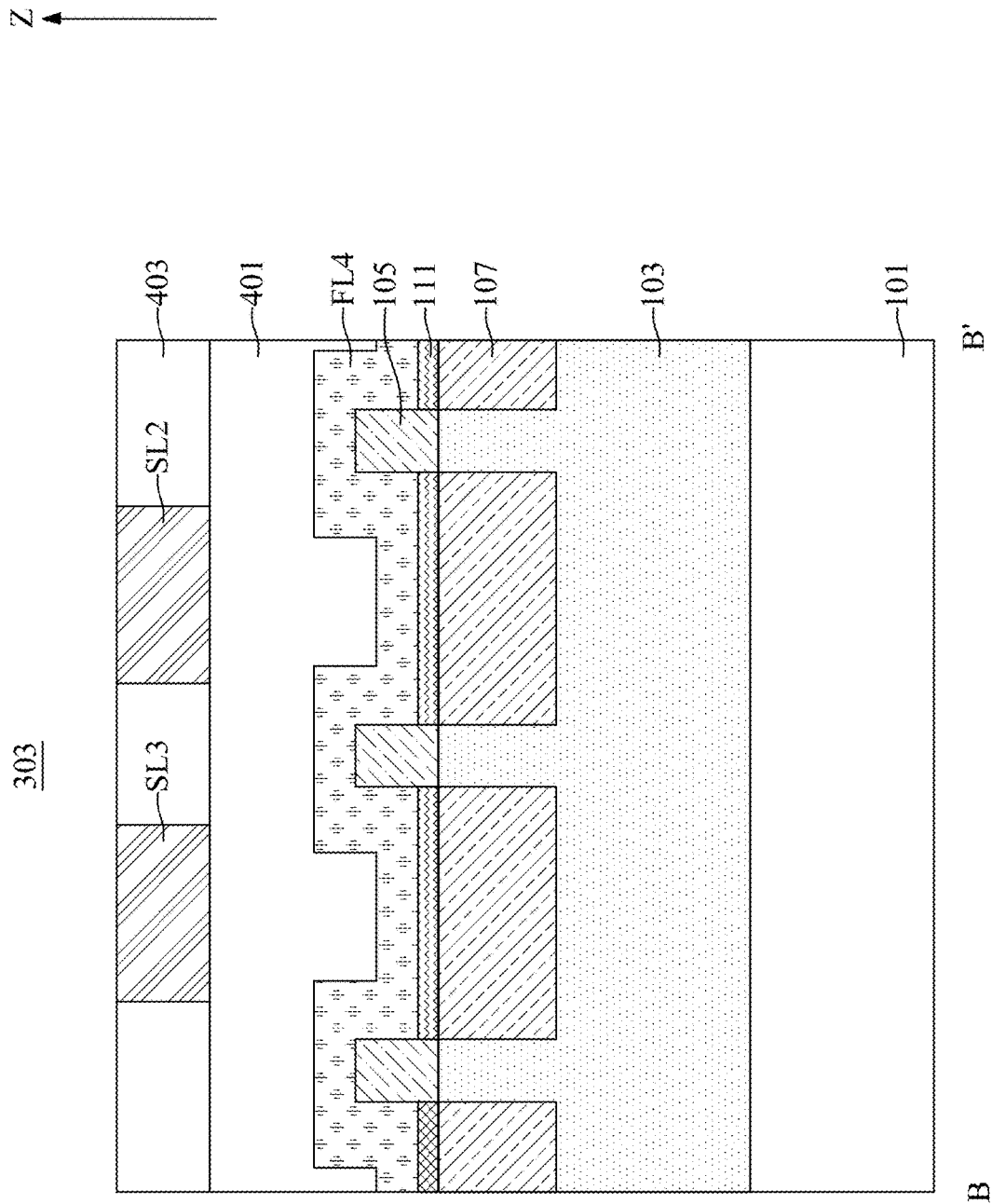

FIG. 19 illustrates, in a schematic top-view diagram, an intermediate semiconductor device in accordance with one embodiment of the present disclosure. FIG. 20 is a schematic cross-sectional view diagram taken along a line A-A' in FIG. 19. FIG. 21 illustrates, in a schematic top-view diagram, an intermediate semiconductor device in accordance with one embodiment of the present disclosure. FIGS. 22 and 23 are schematic cross-sectional view diagrams taken along a line A-A' and a line B-B' in FIG. 14.

With reference to FIG. 1 and FIGS. 19 to 23, at step S21, second conductive lines SL1, SL2, SL3, SL4 may be formed above the substrate 101 to electrically coupled to the bottom conductive layers 107.

With reference to FIGS. 19 and 20, second conductive vias 201 may be formed along the inter-layer dielectric 401 and the first insulating layers 111 to electrically couple to the bottom conductive layers 107. The second conductive vias 201 may be on the programmable regions 305 and may be adjacent to the first conductive lines FL1, FL2, FL3, FL4. The top surfaces of the second conductive vias 201 and the top surfaces of the inter-layer dielectric 401 may be substantially coplanar. The second conductive vias 201 may be formed of, for example, tungsten, cobalt, zirconium, tantalum, titanium, aluminum, ruthenium, copper, metal carbides, metal nitrides, transition metal aluminides or combinations thereof. The second conductive vias 201 may be electrically connected to the bottom conductive layers 107.

In some embodiments, sidewalls of the second conductive via 201 may have a slanted cross-sectional profile. In some embodiments, a width of the second conductive via 201 may gradually become wider from bottom to top along the direction Z. In some embodiments, the second conductive via 201 as a whole may have a uniform slope.

With reference to FIGS. 21 to 23, an inter-layer dielectric 403 may be formed on the inter-layer dielectric 401 and the second conductive vias 201. The inter-layer dielectric 403 may be formed of a same material as the inter-layer dielectric 401 but is not limited thereto. The second conductive lines SL1, SL2, SL3, SL4 may be formed by, for example, a damascene process. In a top-view perspective, the second conductive lines SL1, SL2, SL3, SL4 may be parallel to each other and may extend along a second direction perpendicular to the first direction. In a cross-sectional perspective, the second conductive lines SL1, SL2, SL3, SL4 may be formed on the second conductive vias 201 and in the inter-layer dielectric 403. The second conductive lines SL1, SL2, SL3, SL4 may be electrically coupled to the bottom conductive layers 107 through the second conductive vias 201.

In some embodiments, the second conductive lines SL1, SL2, SL3, SL4 may be formed of, for example, titanium, tantalum, tungsten, copper, or aluminum. In some embodiments, the second conductive lines SL1, SL2, SL3, SL4 may be a stacked layer structure including a BL bottom conductive layer, a BL middle conductive layer formed on the BL bottom conductive layer, and a BL top conductive layer formed on the BL middle conductive layer. The BL bottom conductive layer may be formed of, for example, one of a doped semiconductor material (e.g., doped silicon or doped germanium), a metallic material (e.g., titanium, tantalum, tungsten, copper, or aluminum), and a metal-semiconductor compound (e.g., tungsten silicide, cobalt silicide, or titanium silicide). The BL middle conductive layer may be formed of, for example, conductive metal nitride (e.g., titanium nitride or tantalum nitride). The BL top conductive layer may be formed of, for example, a metallic material (e.g., titanium, tantalum, tungsten, copper, or aluminum).

Figure 24:
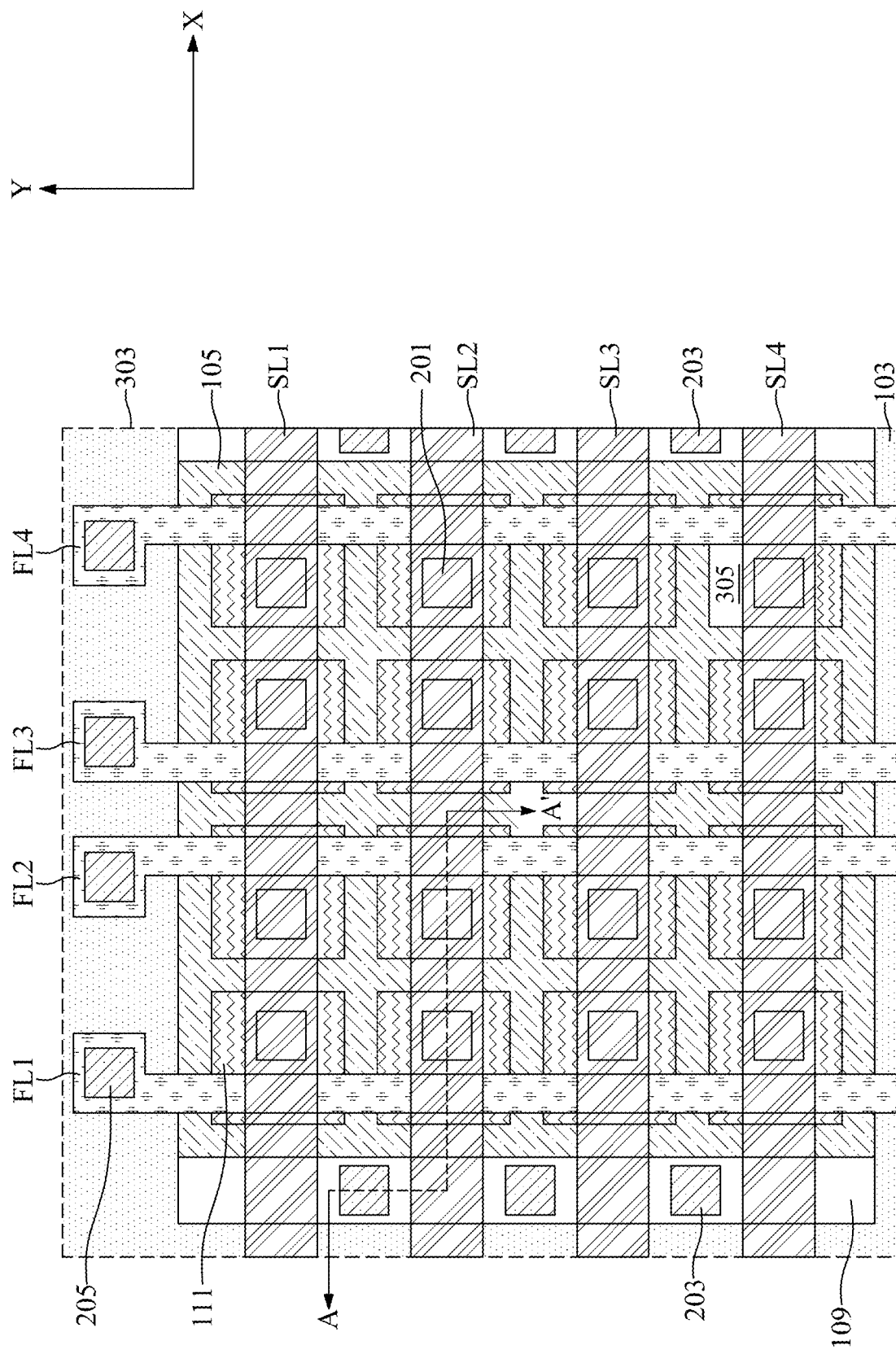
FIG. 24 illustrates, in a schematic top-view diagram, an intermediate semiconductor device in accordance with one embodiment of the present disclosure.
Figure 25:
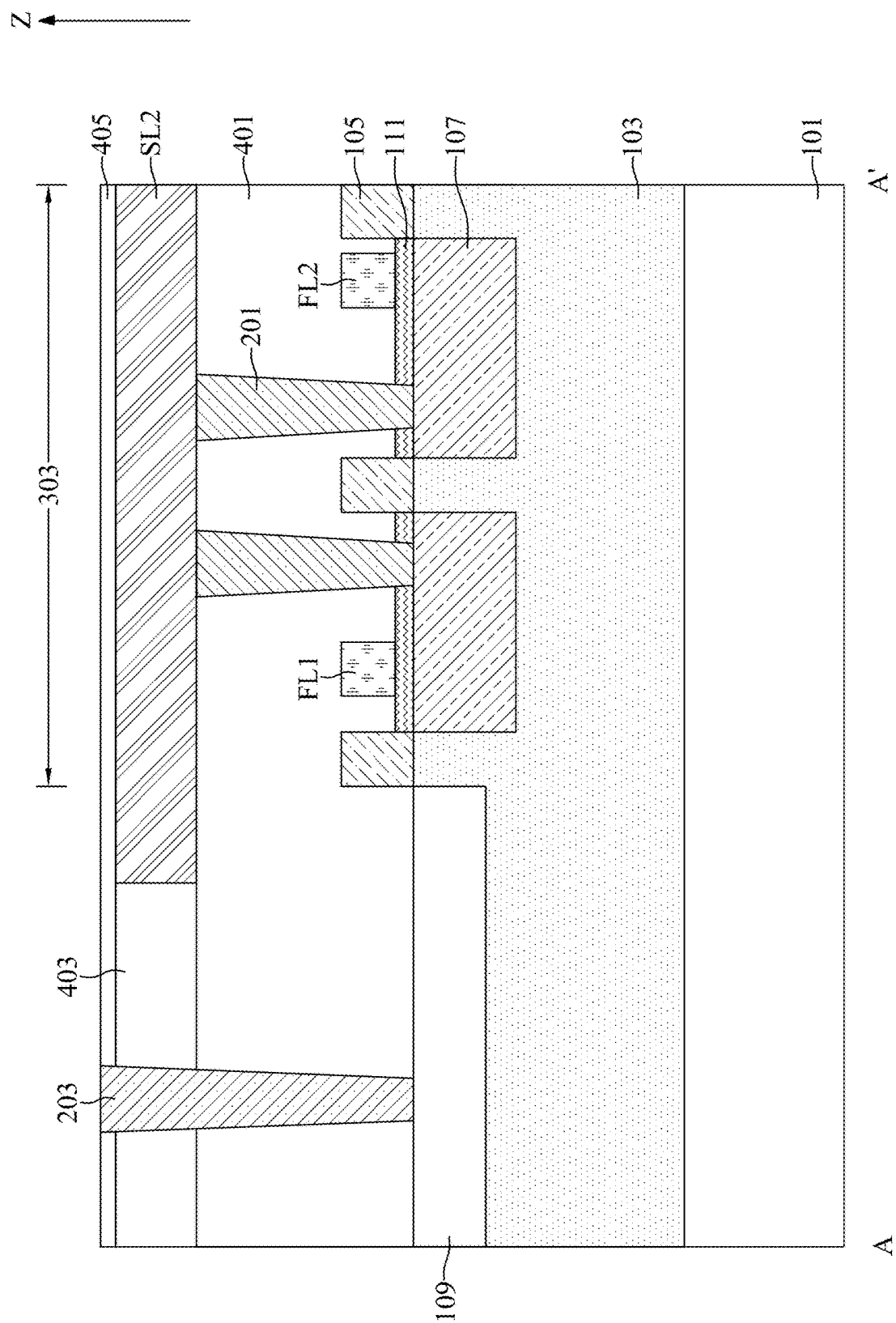
FIG. 25 is a schematic cross-sectional view diagram taken along a line A-A' in FIG. 24.

FIG. 24 illustrates, in a schematic top-view diagram, an intermediate semiconductor device in accordance with one embodiment of the present disclosure. FIG. 25 is a schematic cross-sectional view diagram taken along a line A-A' in FIG. 24. FIG. 26 illustrates, in a schematic top-view diagram, a semiconductor device 1A in accordance with one embodiment of the present disclosure. FIG. 27 is a schematic cross-sectional view diagram taken along a line A-A' in FIG. 26.

With reference to FIG. 1 and FIGS. 24 to 27, at step S23, two first conductive layers 113 may be formed above the second conductive lines SL1, SL2, SL3, SL4 to electrically coupled to the two bias layers 109.

With reference to FIGS. 24 and 25, an inter-layer dielectric 405 may be formed on the inter-layer dielectric 403. The inter-layer dielectric 405 may be formed of a same material as the inter-layer dielectric 403 but is not limited thereto.

With reference to FIGS. 24 and 25, the bias-layer vias 203 may be formed along the inter-layer dielectrics 401, 403, 405 to electrically connect to the two bias layers 109. Concurrently, the first conductive vias 205 may be formed along the inter-layer dielectrics 401, 403, 405 to electrically connect to the upper ends of the first conductive lines FL1, FL2, FL3, FL4. The bias-layer vias 203 and the first conductive vias 205 may have slanted sidewalls similar to the second conductive vias 201.

With reference to FIGS. 26 and 27, an inter-layer dielectric 407 may be formed on the inter-layer dielectric 405. The inter-layer dielectric 407 may be formed of a same material as the inter-layer dielectric 405 but is not limited thereto.

In a top-view perspective, the two first conductive layers 113 may be parallel to each other and may extend along the first direction. In a cross-sectional perspective, the two first conductive layers 113 may be formed on the bias-layer vias 203 and in the inter-layer dielectric 407. The two first conductive layers 113 may be formed by a damascene process. The two first conductive layers 113 may be formed of, for example, titanium, tantalum, tungsten, copper, or aluminum. The two first conductive layers 113 may be electrically coupled to the two bias layers 109 through the bias-layer vias 203.

During a programming procedure, the programming unit to be programmed (selected programming unit) can be determined by the baseline voltages applied to the second conductive lines SL1, SL2, SL3, SL4 and the programming voltages applied to the first conductive lines FL1, FL2, FL3, FL4. Generally, the first conductive line which is electrically coupled to the selected programming unit may be applied a programming voltage $V_P$. The programming voltage $V_P$ may be 5.5 volts, 6.0 volts, 6.5 volts, or any number between 5.2 volts and 6.5 volts. The voltage applied to the first conductive lines which are not electrically coupled to selected programming unit may be set to at least half of the programming voltage $V_P$ or at or close to 0 volts. The second conductive line which is electrically coupled to the selected programming unit may be applied a baseline voltage $V_{BL}$. The baseline voltage $V_{BL}$ may be at or close to 0 volts. The voltage applied to the second conductive lines which are not electrically coupled to selected programming unit may be set to at least half of the programming voltage $V_P$. By applying different voltages to first conductive lines and second conductive lines, the programmable units may be programmed one at a time or multiple programmable units may be programmed simultaneously.

For example, when the programmable unit P01 is to be programmed, the first conductive line FL1 may be set to a programming voltage 6 volts, the voltages of the first conductive lines FL2, FL3, FL4 may be set to 4 volts, the second conductive line SL1 may be grounded, and the voltages of the second conductive lines SL2, SL3, SL4 may be set to 4 volts. With such programming configuration, a great voltage difference may be applied to the top surface and the bottom surface of the first insulating layer 111 of the programmable unit P01 to form a strong electrical field. The resulting strong electrical field in the first insulating layer 111 leads the first insulating layer 111 to breakdown. Consequently, the programmable unit P01 is blown and programmed.

For another example, when the programmable units P02, P10 are to be programmed, the first conductive line FL2 may be set to a programming voltage 6 volts, the voltages of the first conductive lines FL1, FL3, FL4 may be set to 4 volts, the second conductive lines SL1, SL3 may be grounded, and the voltages of the second conductive lines SL2, SL4 may be set to 4 volts. With such programming configuration, strong electrical fields may be respectively formed in first insulating layers 111 of the programmable units P02, P10. The resulting strong electrical fields in the first insulating layers 111 leads the first insulating layers 111 to breakdown. Consequently, the programmable unit P02, P10 are simultaneously blown and programmed.

It should be noted that, during operation of the semiconductor device 1A, a biased voltage may be continuously applied to the bias layers 109 through the first conductive layer 113. The value of the biased voltage may be less than the voltages (e.g., the baseline voltages) applied to the bottom conductive layers 107. The voltage difference between the biased voltage and the baseline voltage may form the depletion regions surrounding the bottom conductive layers 107 to electrically isolate adjacent pairs of the bottom conductive layers 107. That is, no other electrically isolation structure such as a dielectric layer is needed between the adjacent pairs of the bottom conductive layers 107. Accordingly, the uniformity of the thickness of the first insulating layers 111 may be improved due to lack of interfering dielectric layers such as shallow trench isolation. As a result, the reliability of programming of the semiconductor device 1A may be improved.

Figure 28:
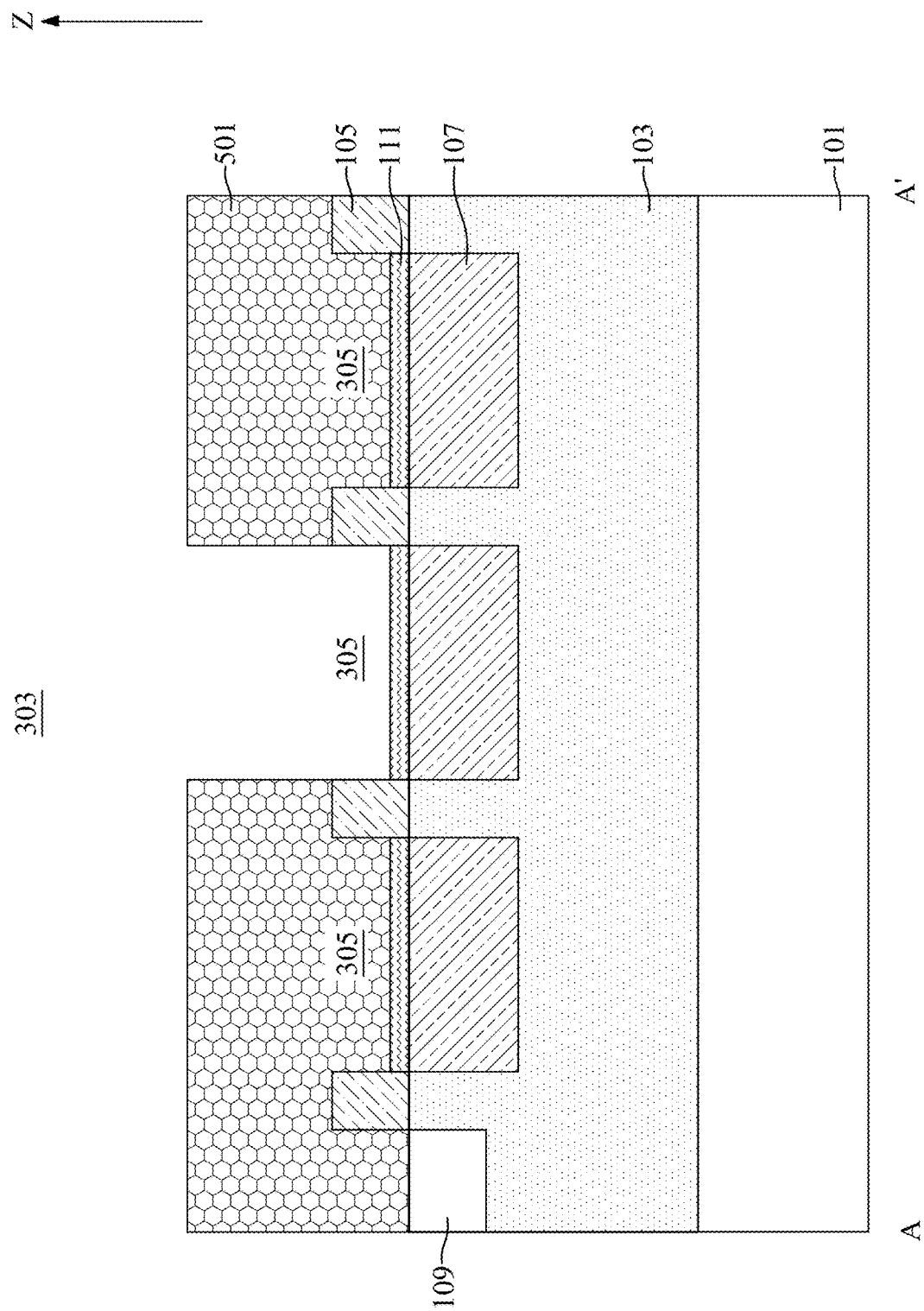
FIG. 28 is a schematic cross-sectional view diagram taken along a line A-A' in FIG. 8 illustrating an intermediate semiconductor device in accordance with another embodiment of the present disclosure.
Figure 29:
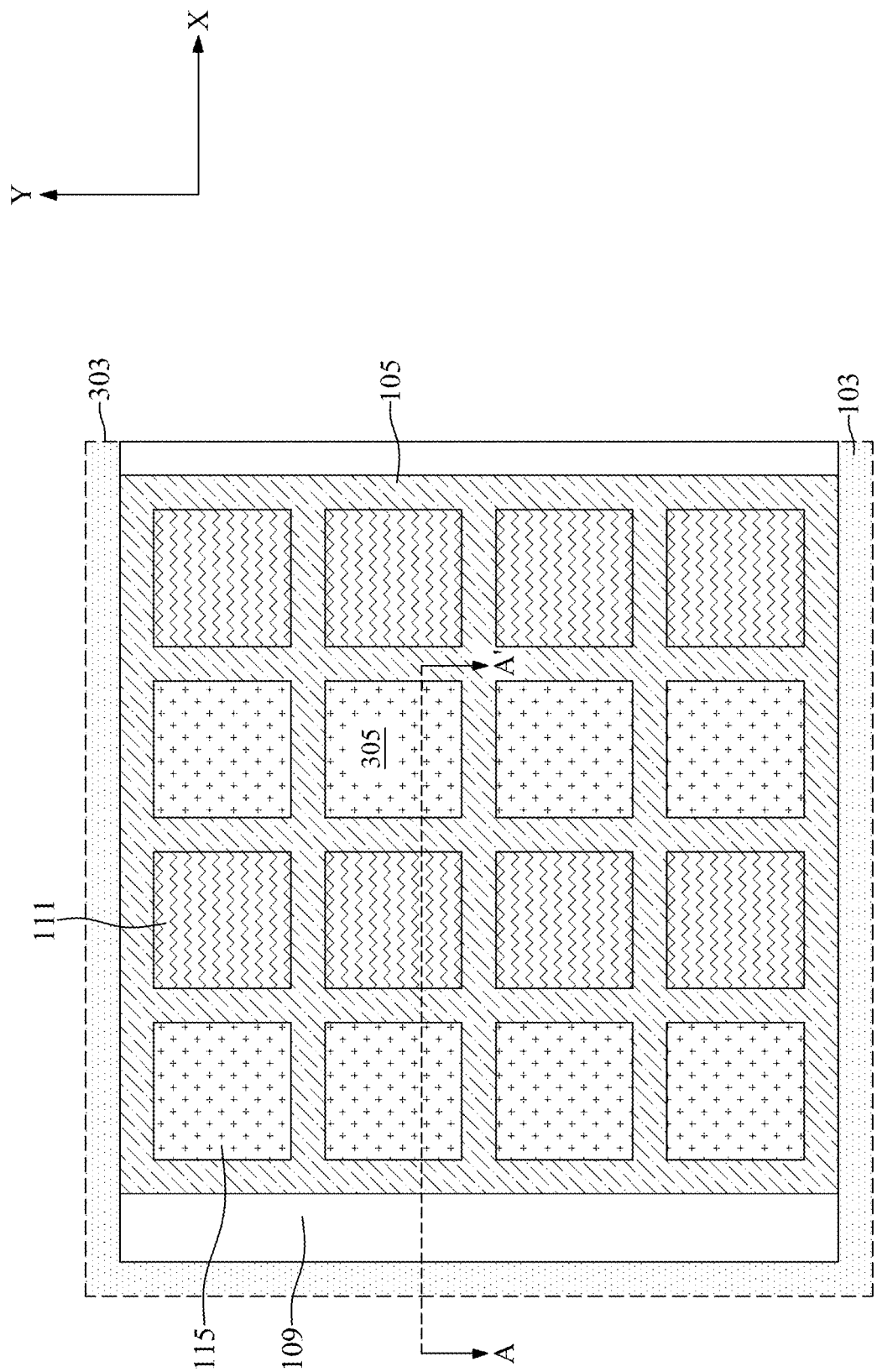
FIG. 29 illustrates, in a schematic top-view diagram, an intermediate semiconductor device in accordance with another embodiment of the present disclosure.
Figure 30:
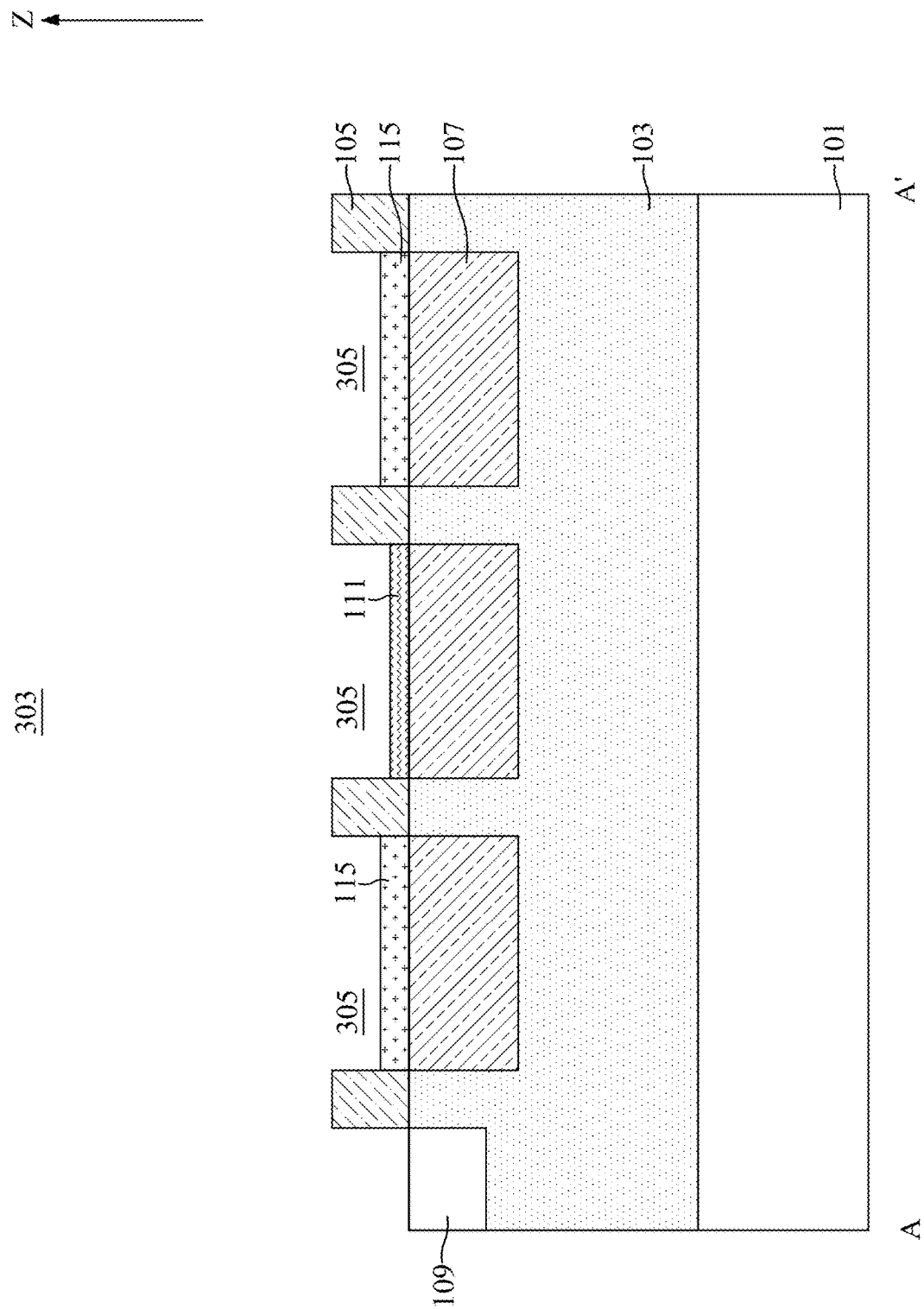
FIG. 30 is a schematic cross-sectional view diagram taken along a line A-A' in FIG. 29.
Figure 31:
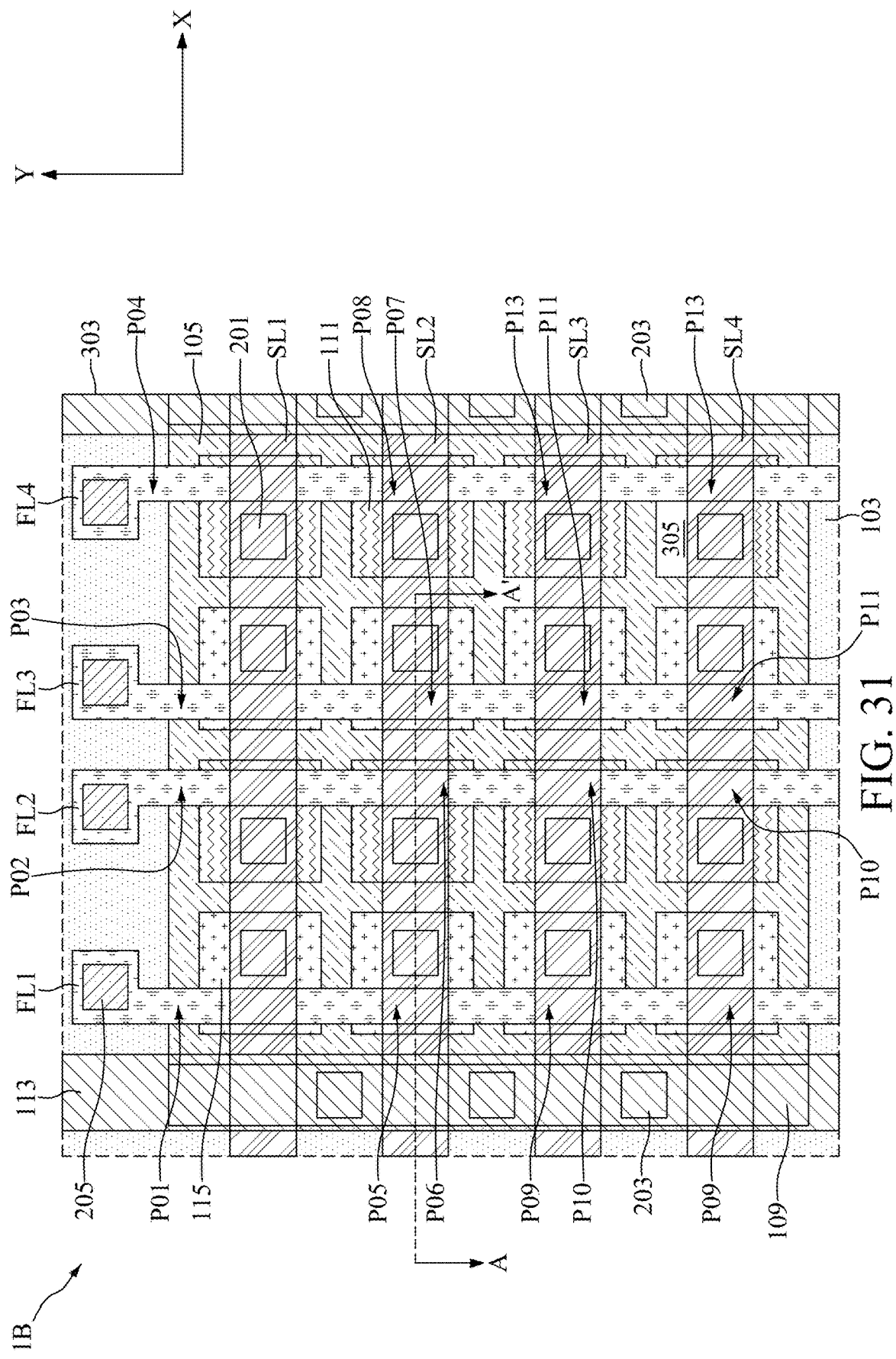
FIG. 31 illustrates, in a schematic top-view diagram, a semiconductor device in accordance with another embodiment of the present disclosure.
Figure 32:
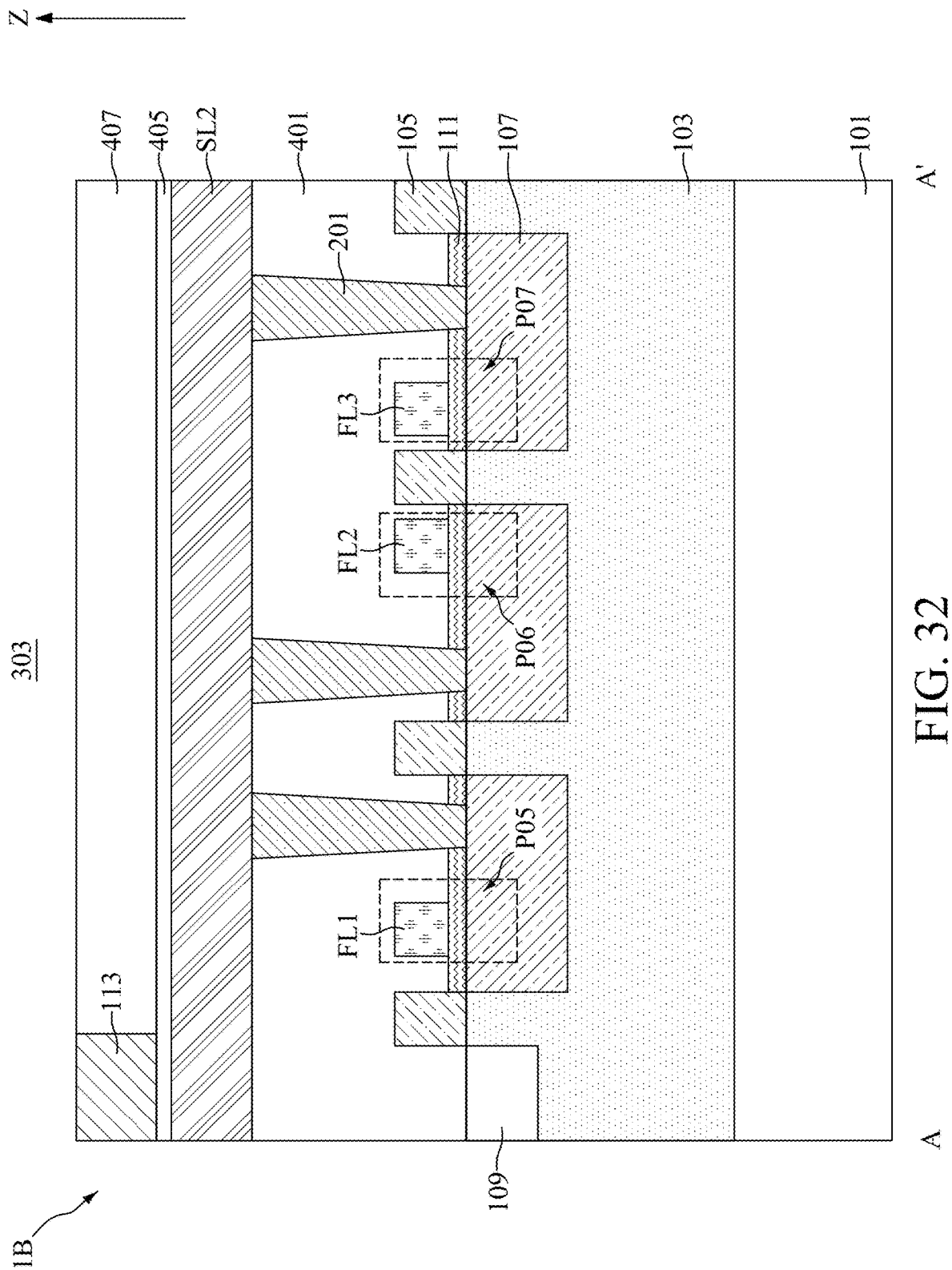
FIG. 32 is a schematic cross-sectional view diagram taken along a line A-A' in FIG. 29.

FIG. 28 is a schematic cross-sectional view diagram taken along a line A-A' in FIG. 8 illustrating an intermediate semiconductor device in accordance with another embodiment of the present disclosure. FIG. 29 illustrates, in a schematic top-view diagram, an intermediate semiconductor device in accordance with another embodiment of the present disclosure. FIG. 30 is a schematic cross-sectional view diagram taken along a line A-A' in FIG. 29. FIG. 31 illustrates, in a schematic top-view diagram, a semiconductor device 1B in accordance with another embodiment of the present disclosure. FIG. 32 is a schematic cross-sectional view diagram taken along a line A-A' in FIG. 29.

With reference to FIG. 28, an implantation-mask layer 501 may be formed on the substrate 101 to cover the bias layers 109 and some portions of the bottom conductive layers 107. For example, two sides of the bottom conductive layers 107 in FIG. 28 may be covered by the implantation-mask layer 501 and the middle one of the bottom conductive layers 107 in FIG. 28 may be exposed. Subsequently, a nitrogen implantation process may be performed to the exposed bottom conductive layers 107. After the nitrogen implantation, the implantation-mask layer 501 may be removed.

With reference to FIGS. 29 and 30, first insulating layers 111 and second insulating layers 115 may be formed by, for example, thermal oxidation. Due to the implantation of nitrogen, the first insulating layers 111 and the second insulating layers 115 may have different thicknesses. The first insulating layers 111 formed on the exposed bottom conductive layers 107 during the nitrogen implantation process may have thinner thickness than the thickness of the second insulating layers 115 formed on the covered bottom conductive layers 107 during the nitrogen implantation process. As the threshold programming voltage may be affected by the thickness of the insulating layers, the programming units consisting of the first insulating layers 111 and the second insulating layers 115 may have different threshold programming voltages.

With reference to FIGS. 31 and 32, the other elements of the semiconductor device 1B may be formed with a procedure similar to that illustrated in FIGS. 17 to 27. In the present embodiments, the programmable units having different threshold voltage (e.g., the programmable units P05, P06) may be used for different purposes.

Figure 33:
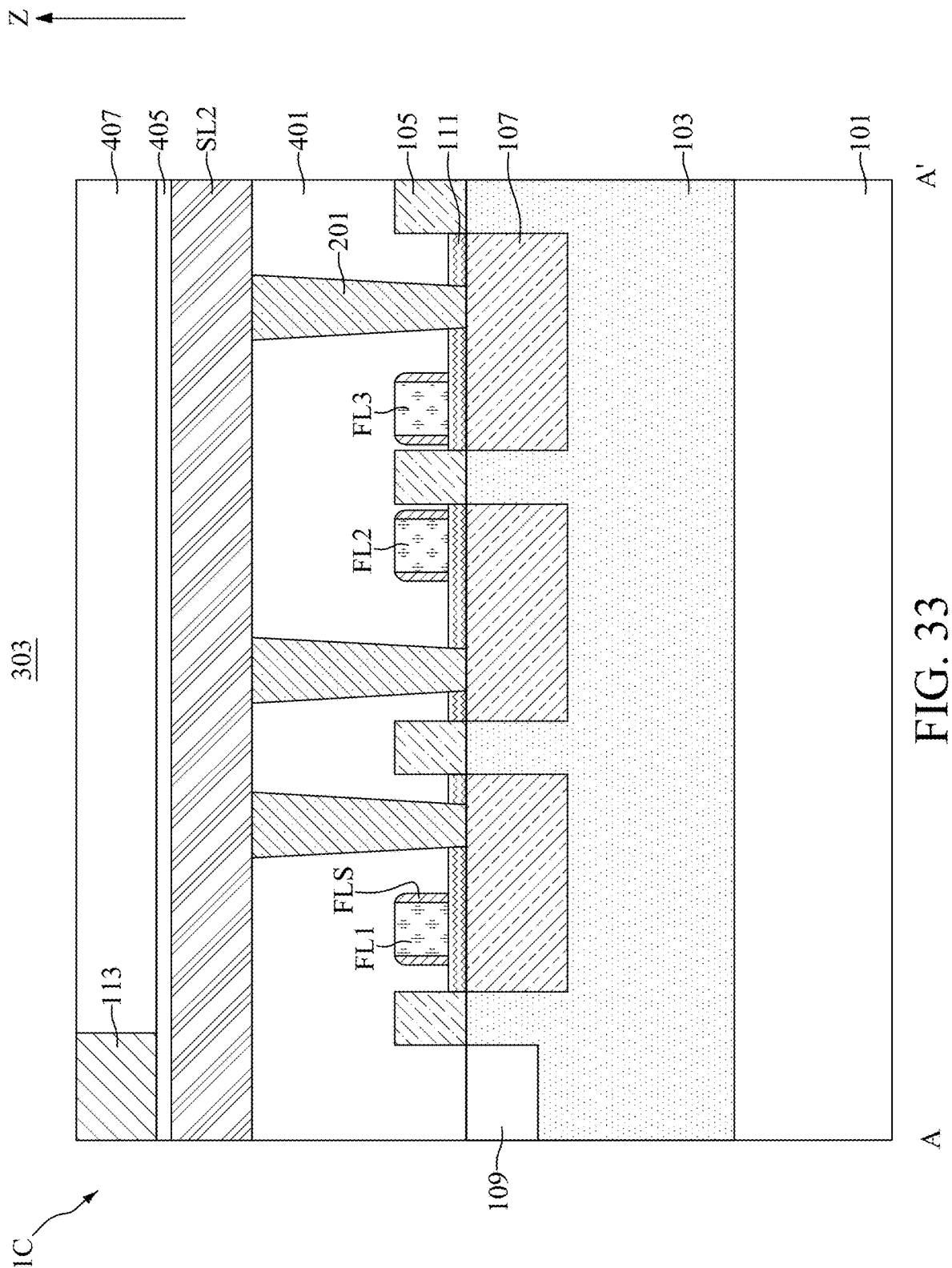
FIG. 33 is a schematic cross-sectional view diagram taken along a line A-A' in FIG. 31 illustrating a semiconductor device in accordance with another embodiment of the present disclosure.

FIG. 33 is a schematic cross-sectional view diagram taken along a line A-A' in FIG. 31 illustrating a semiconductor device 1C in accordance with another embodiment of the present disclosure.

With reference to FIG. 33, the semiconductor device 1C may have a structure similar to that illustrated in FIG. 32. The same or similar elements in FIG. 33 as in FIG. 32 have been marked with similar reference numbers and duplicative descriptions have been omitted. The semiconductor device 1C may include first spacers FLS. The first spacers FLS may be disposed on sidewalls of the first conductive lines FL1, FL2, FL3, FL4. In some embodiments, the first spacers FLS may be formed of, for example, a dielectric material different from the first insulating layers 111 or the second insulating layers 115. In some embodiments, the first spacers FLS may be formed of, for example, silicon nitride. The first spacers FLS may provide additional electrical isolation to the first conductive lines FL1, FL2, FL3, FL4. The first spacers FLS may also provide additional protection during the formation of the second conductive vias 201.

Figure 34:
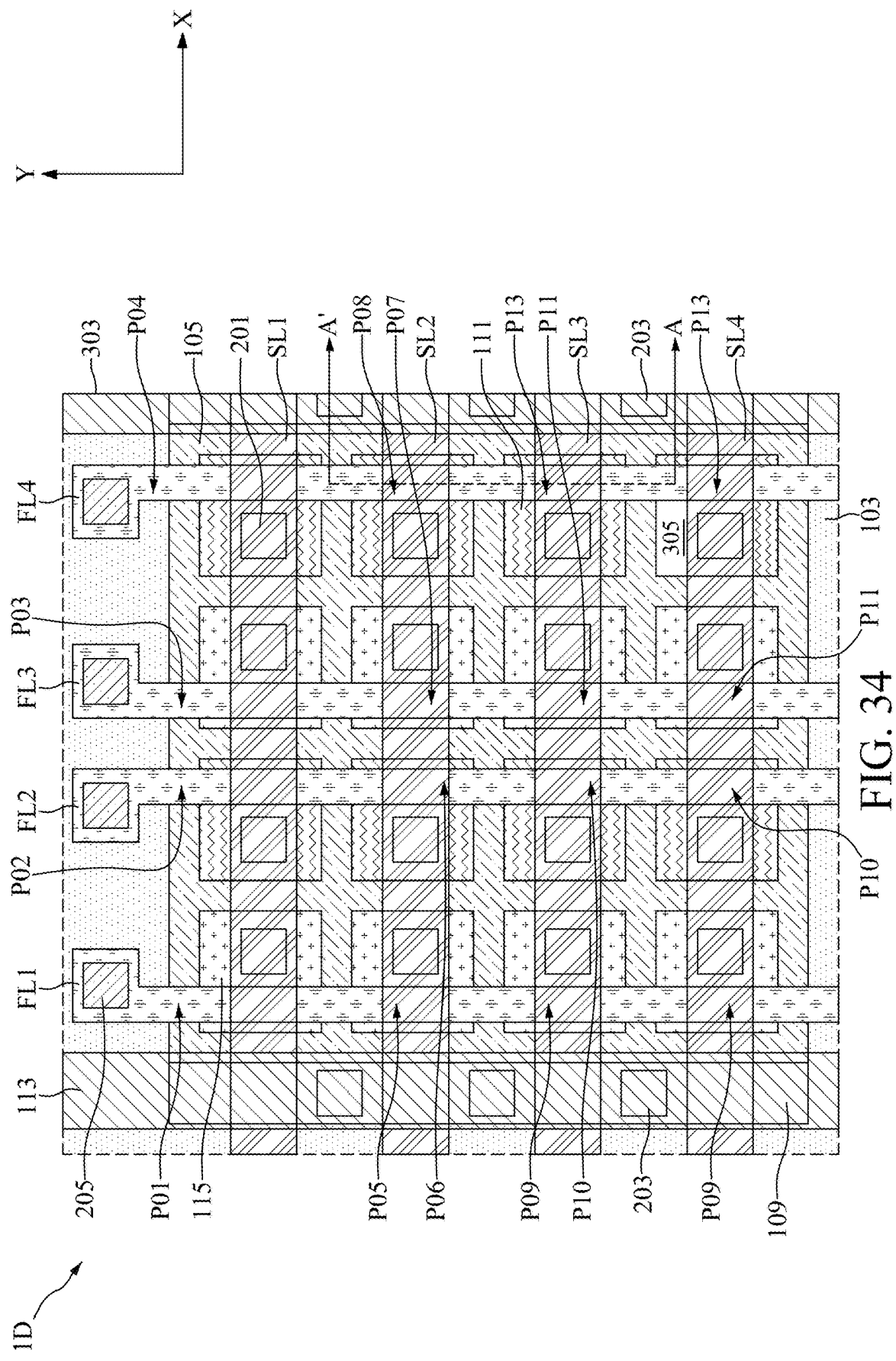
FIG. 34 illustrates, in a schematic top-view diagram, a semiconductor device in accordance with another embodiment of the present disclosure.
Figure 35:
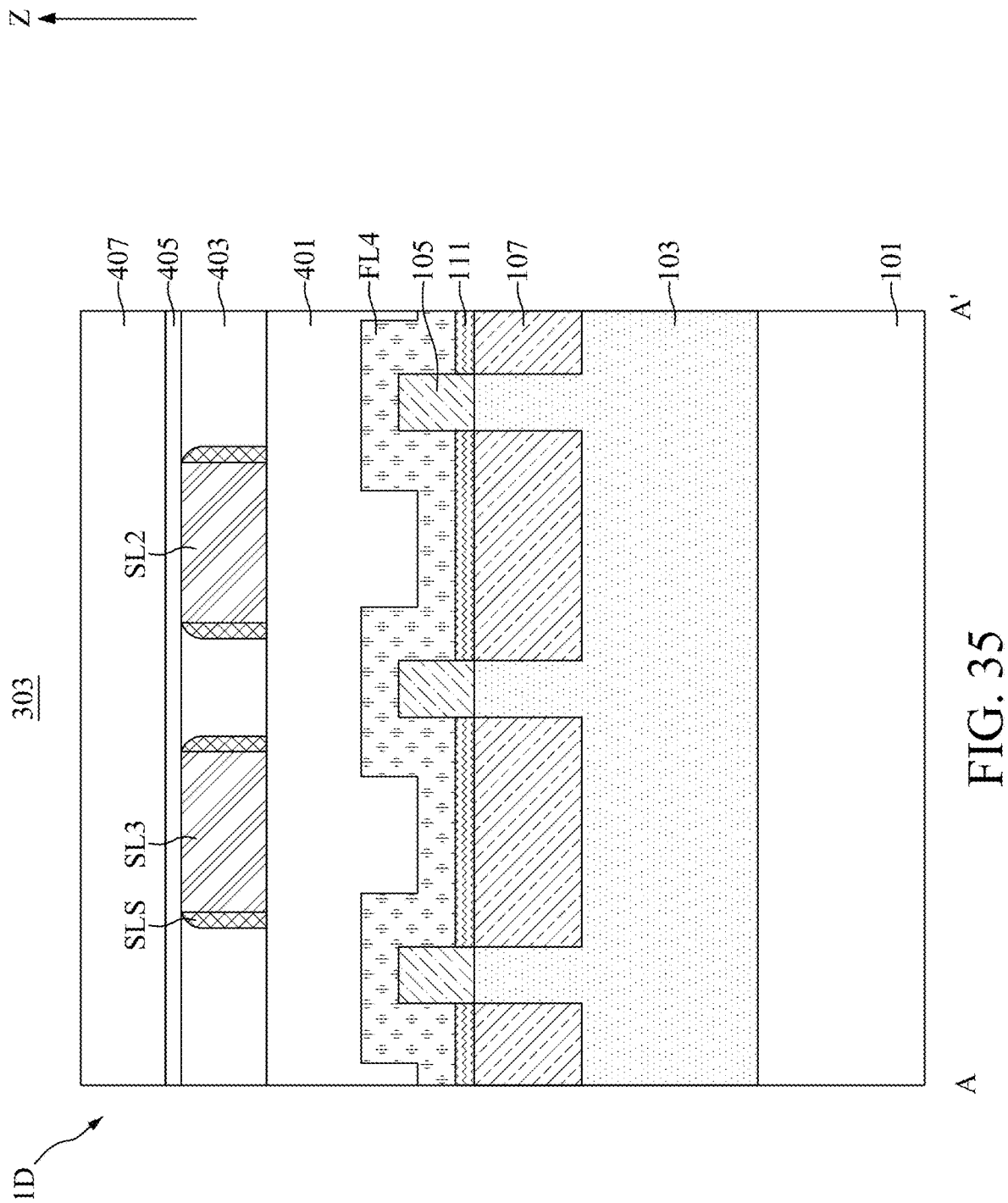
FIG. 35 is a schematic cross-sectional view diagram taken along a line A-A' in FIG. 34.

FIG. 34 illustrates, in a schematic top-view diagram, a semiconductor device 1D in accordance with another embodiment of the present disclosure. FIG. 35 is a schematic cross-sectional view diagram taken along a line A-A' in FIG. 34.

With reference to FIGS. 34 and 35, the semiconductor device 1D may include second spacers SLS. The second spacers SLS may be disposed on sidewalls of the second spacers SLS. The second spacers SLS may be formed of, for example, silicon nitride, silicon nitride, silicon oxynitride, or silicon nitride oxide. The second spacers SLS may provide additional electrical isolation to the second conductive lines SL1, SL2, SL3, SL4.

Figure 36:
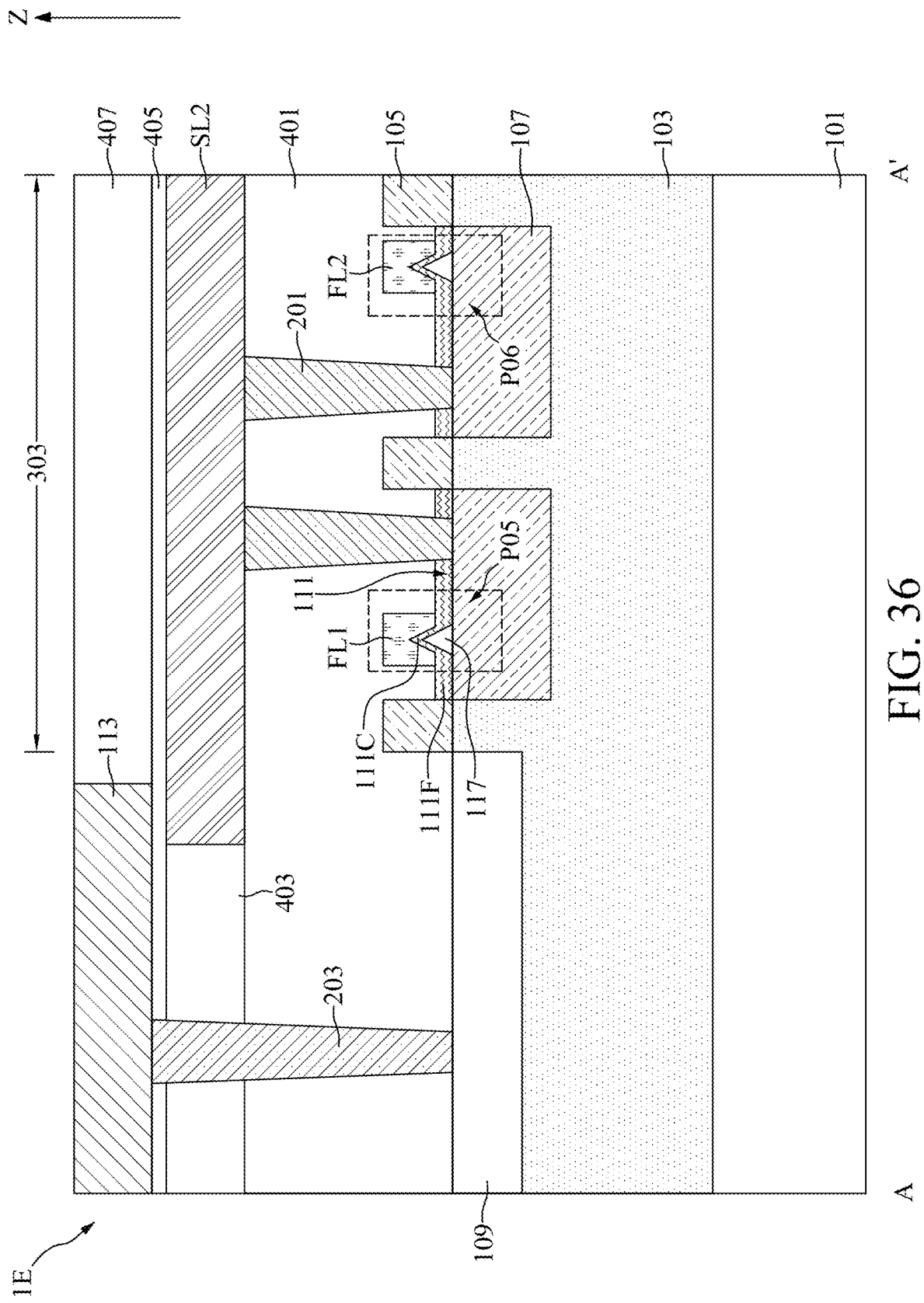
FIGS. 36 to 38 are schematic cross-sectional view diagrams taken along a line A-A' in FIG. 26 illustrating some semiconductor devices in accordance with some embodiments of the present disclosure.
Figure 37:
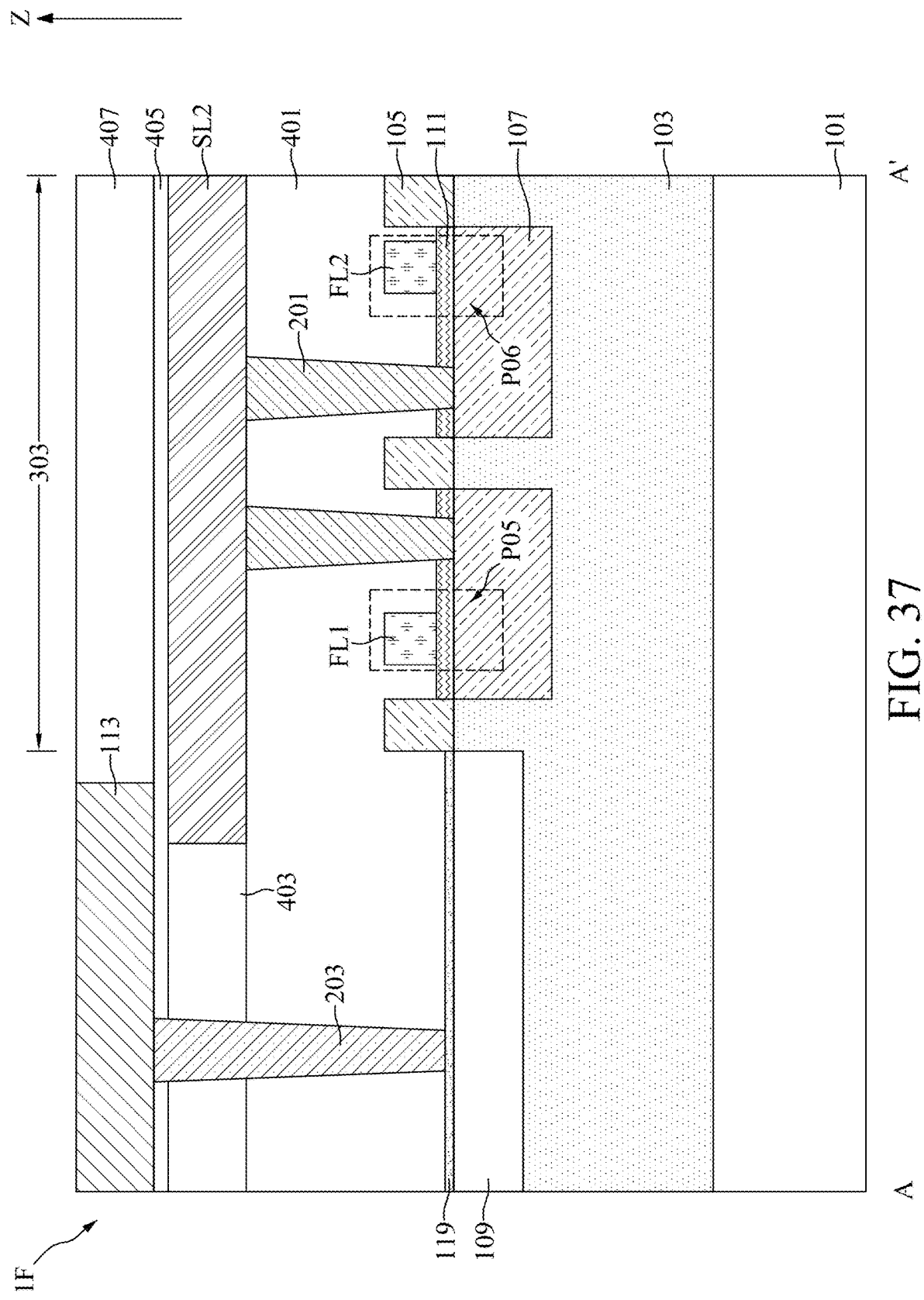
Figure 38:
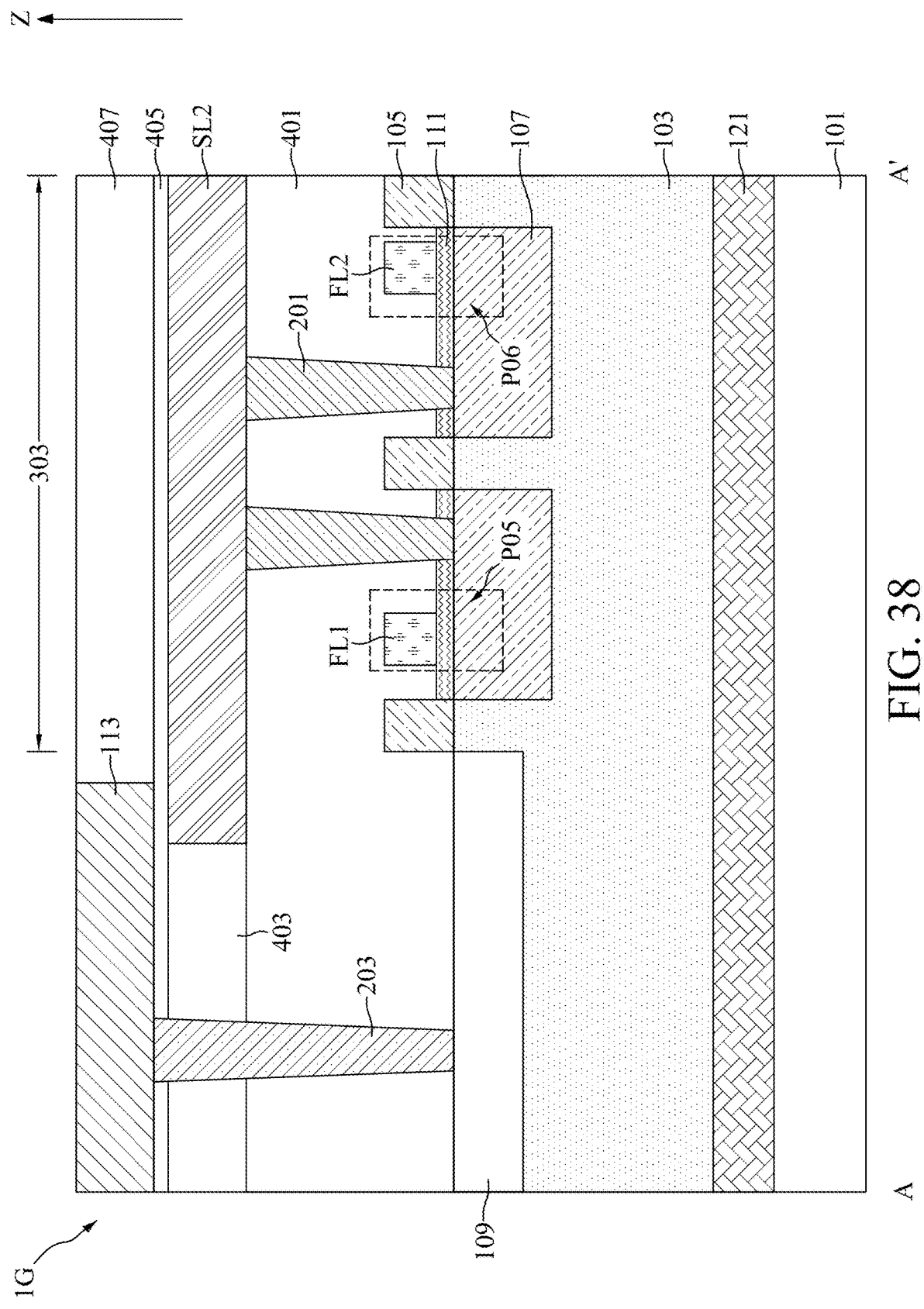

FIGS. 36 to 38 are schematic cross-sectional view diagrams taken along a line A-A' in FIG. 26 illustrating some semiconductor devices 1E, 1F, and 1G in accordance with some embodiments of the present disclosure.

With reference to FIG. 36, the semiconductor device 1E may have a structure similar to that illustrated in FIG. 27. The same or similar elements in FIG. 36 as in FIG. 27 have been marked with similar reference numbers and duplicative descriptions have been omitted.

With reference to FIG. 36, the semiconductor device 1E may include tip portions 117. For convenience of description, only one top portion 117, one first insulating layer 111, and one bottom conductive layer 107 are described. The top portion 117 may be disposed between the bottom conductive layer 107 and the first insulating layer 111. The top portion 117 may have a cross-sectional profile which is a triangular shape. In some embodiments, the top portion 117 may have cross-sectional profile which is a diamond shape, a pentagonal shape, or a shape having more than five sides. The top portion 117 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials.

With reference to FIG. 36, the first insulating layer 111 may be disposed on the top portion 117 and the bottom conductive layer 107. The first insulating layer 111 may include a capping portion 111C and two flat portions 111F. The capping portion 111C may be disposed on two sides of the top portion 117. The two flat portions 111F may be respectively correspondingly connected to two ends of the capping portion 111C. The two flat portions 111F may be disposed on the bottom conductive layer 107. A thickness of the two flat portions 111F may be greater than or equal to a thickness of the capping portion 111C. In some embodiments, the thickness of the two flat portions 111F may be greater than the thickness of the capping portion 111C.

During programming of the semiconductor device 1E, the vertex of the top portion 117 may be the most vulnerable part because electrical fields concentrate at the sharp profile. Since the vertex of the top portion 117 may obtain the highest electrical fields, the capping portion 111C may be broken down to form a rupture point of the capping portion 111C adjacent to the vertex of the top portion 117 and a resistance reduction may be induced accordingly. Consequently, the semiconductor device 1E is blown and programmed. The position of the rupture point of the capping portion 111C may be easily limited in the place adjacent to the vertex of the top portion 117 having the highest electrical fields during programming. As result, the reliability of programming of the semiconductor device 1E may be increased.

With reference to FIG. 37, the semiconductor device 1F may have a structure similar to that illustrated in FIG. 27. The same or similar elements in FIG. 37 as in FIG. 27 have been marked with similar reference numbers and duplicative descriptions have been omitted.

With reference to FIG. 37, the semiconductor device 1F may include a first assistance layer 119. The first assistance layer 119 may be formed between the bias-layer vias 203 and the bias layers 109. A thickness of the first assistance layer 119 may be between about 2 nm and about 20 nm. The first assistance layer 119 may be formed of, for example, titanium silicide, nickel silicide, nickel platinum silicide, tantalum silicide, or cobalt silicide. The first assistance layer 119 may reduce the resistance between the bias-layer vias 203 and the bias layers 109. Accordingly, the performance of the semiconductor device 1F may be improved.

With reference to FIG. 38, the semiconductor device 1G may have a structure similar to that illustrated in FIG. 27. The same or similar elements in FIG. 38 as in FIG. 27 have been marked with similar reference numbers and duplicative descriptions have been omitted.

With reference to FIG. 38, the semiconductor device 1G may include a deep well layer 121. In some embodiments, the deep well layer 121 may be disposed under the first well layer 103. In some embodiments, the deep well layer 121 may be disposed surrounding the first well layer 103. The deep well layer 121 may have the second electrical type that is opposite to the first electrical type of the first well layer 103. The dopant concentration of the deep well layer 121 may be less than the dopant concentration of the first well layer 103. For example, the dopant concentration of the deep well layer 121 may be between about $1E16/cm^3$ and about $1E18/cm^3$. The presence of the deep well layer 121 may greatly reduce the read voltage offset, allow faster read speed and lower read voltage, and reduce current leakage during a programming procedure.

In some embodiments, the substrate 101 may include a semiconductor-on-insulator structure which is consisted of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm.

One aspect of the present disclosure provides a semiconductor device including a substrate, a first well layer positioned in the substrate and having a first electrical type, a bottom conductive layer positioned in the first well layer and having a second electrical type opposite to the first electrical type, a first insulating layer positioned on the bottom conductive layer, an isolation-mask layer positioned on the substrate and enclosing the first insulating layer, a first conductive line positioned on the first insulating layer, and a bias layer positioned in the first well layer and spaced apart from the bottom conductive layer. The bottom conductive layer, the first insulating layer, and the first conductive line together configure a programmable unit.

Another aspect of the present disclosure provides a semiconductor device including a substrate including a first well region, a first well layer positioned in the first well region and having a first electrical type, bottom conductive layers positioned in the first well layer and are spaced apart from each other, first insulating layers positioned on the bottom conductive layers, an isolation-mask layer positioned on the first well region and enclosing the first insulating layers, first conductive lines positioned on the first insulating layers and parallel to each other, a bias layer positioned in the first well layer and spaced apart from the bottom conductive layers. The bottom conductive layers have a second electrical type opposite to the first electrical type. The bottom conductive layers, the first insulating layers, the first conductive lines together configure programmable units.

Another aspect of the present disclosure provides a method for fabricating a semiconductor device including providing a substrate, forming a first well layer in the substrate and having a first electrical type, forming an isolation-mask layer on the first well layer, forming mask openings along the isolation-mask layer to expose portions of the first well layer, forming bottom conductive layers in the portions of the first well layer, forming a bias layer in the first well layer and spaced apart from the bottom conductive layers, forming first insulating layers on the bottom conductive layers, forming first conductive lines on the first insulating layers and parallel to each other. The bottom conductive layers have a second electrical type opposite to the first electrical type. The bottom conductive layers, the first insulating layers, the first conductive lines together configure programmable units.

Due to the design of the semiconductor device of the present disclosure, the bottom conductive layers 107 may be electrically isolated with a presence of biased voltage applied to the first well layer 103. As a result, a large amount of area of the substrate 101 may be saved for more functional elements such as programmable units. In addition, the uniformity of the first insulating layers 111 may also be improved. As a result, the reliability of programming the semiconductor device 1A may be improved.

It should be noted that some elements such as the inter-layer dielectrics may be omitted in figures in top-view perspective for clarity.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first well layer positioned in the substrate and having a first electrical type;
a bottom conductive layer positioned in the first well layer and having a second electrical type opposite to the first electrical type;
a first insulating layer positioned on the bottom conductive layer;
an isolation-mask layer positioned on the substrate and enclosing the first insulating layer;
a first conductive line positioned on the first insulating layer;
a bias layer positioned in the first well layer and spaced apart from the bottom conductive layer; and
a second conductive line positioned above the bottom conductive layer and electrically coupled to the bottom conductive layer;
wherein the bottom conductive layer, the first insulating layer, and the first conductive line together configure a programmable unit.

2. The semiconductor device of claim 1, further comprising a first conductive layer positioned above the bias layer and electrically coupled to the bias layer.

3. The semiconductor device of claim 2, wherein the bias layer has a same electrical type as the first well layer and a dopant concentration of the bias layer is greater than that of the first well layer.

4. The semiconductor device of claim 3, wherein the first conductive line extends along a first direction in a top-view perspective and the second conductive line extends along a second direction perpendicular to the first direction.

5. The semiconductor device of claim 4, wherein a thickness of the first insulating layer is between about 30 nm and about 70 nm.

6. The semiconductor device of claim 5, further comprising a first assistance layer positioned on the bias layer; wherein the first assistance layer is formed of titanium silicide, nickel silicide, nickel platinum silicide, tantalum silicide, or cobalt silicide.

7. The semiconductor device of claim 6, wherein a thickness of the first assistance layer is between about 2 nm and about 20 nm.

8. The semiconductor device of claim 5, further comprising first spacers positioned on sidewalls of the first conductive line; wherein the first spacers are formed of a dielectric material different from the first insulating layer.

9. The semiconductor device of claim 5, further comprising second spacers positioned on sidewalls of the second conductive line; wherein the second spacers are formed of silicon nitride, silicon nitride, silicon oxynitride, or silicon nitride oxide.

10. The semiconductor device of claim 5, further comprising a top portion positioned between the first insulating layer and the bottom conductive layer; wherein the tip portion is formed of silicon, germanium, silicon germanium, silicon carbon, silicon germanium carbon, gallium, gallium arsenic, indium arsenic, or indium phosphorus.

11. The semiconductor device of claim 10, wherein the first insulating layer comprises a capping portion positioned on the tip portion and flat portions connecting to two ends of the capping portion and positioned on the bottom conductive layer.

12. The semiconductor device of claim 5, further comprising a deep well layer positioned surrounding the first well layer and having the second electrical type.

* * * * *